US009817714B2

(12) United States Patent
Halbert et al.

(10) Patent No.: US 9,817,714 B2
(45) Date of Patent: Nov. 14, 2017

(54) MEMORY DEVICE ON-DIE ERROR CHECKING AND CORRECTING CODE

(71) Applicant: Intel Corporation, Santa Clara, CA (US)

(72) Inventors: John B Halbert, Beaverton, OR (US); Kuljit S Bains, Olympia, WA (US); Kjersten E Criss, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,142

(22) Filed: Dec. 26, 2015

(65) Prior Publication Data

US 2017/0063394 A1   Mar. 2, 2017

Related U.S. Application Data

(60) Provisional application No. 62/211,448, filed on Aug. 28, 2015.

(51) Int. Cl.
*G06F 11/10* (2006.01)
*G11C 29/52* (2006.01)
(Continued)

(52) U.S. Cl.
CPC .......... *G06F 11/1068* (2013.01); *G06F 3/064* (2013.01); *G06F 3/0619* (2013.01); *G06F 3/0679* (2013.01); *G06F 11/1048* (2013.01); *G11C 29/42* (2013.01); *G11C 29/52* (2013.01); *H03M 13/095* (2013.01); *H03M 13/6566* (2013.01); *G11C 11/401* (2013.01)

(58) Field of Classification Search
CPC .... G06F 11/1028; G06F 11/08; G06F 11/108; G06F 11/1048; G06F 11/1068; G11C 29/42; G11C 29/52; H03M 13/6566
See application file for complete search history.

(56) References Cited

U.S. PATENT DOCUMENTS 5,638,385 A * 6/1997 Fifield ................. G06F 11/1008
714/763
6,052,818 A * 4/2000 Dell ........................ G06F 11/10
714/763

(Continued)

OTHER PUBLICATIONS

International Search Report and Written Opinion for PCT Patent Application No. PCT/US2016/045639, dated Nov. 7, 2016, 12 pages.

(Continued)

*Primary Examiner* — Shelly A Chase
(74) *Attorney, Agent, or Firm* — Compass IP Law PC

(57) ABSTRACT

In a system where a memory device performs on-die ECC, the ECC operates on N-bit data words as two (N/2)-bit segments, with a code matrix having a corresponding N codes that can be operated on as a first portion of (N/2) codes and a second portion of (N/2) codes to compute first and second error checks for first and second (N/2)-bit segments of the data word, respectively. In the code matrix, a bitwise XOR of any two codes in the first portion of the code matrix or any two codes in the second portion of the code matrix results in a code that is either not in the code matrix or is in the other portion of the code matrix. Thus, a miscorrected double bit error in one portion causes a bit to be toggled in the other portion instead of creating a triple bit error.

22 Claims, 11 Drawing Sheets

(51) Int. Cl.
*G06F 3/06* (2006.01)
*H03M 13/09* (2006.01)
*H03M 13/00* (2006.01)
*G11C 29/42* (2006.01)
*G11C 11/401* (2006.01)

(56) References Cited

U.S. PATENT DOCUMENTS

| | | | |
|---|---|---|---|
| 6,487,685 B1 | 11/2002 | Fiske et al. | |
| 6,957,378 B2 * | 10/2005 | Koga | G06F 11/1032 714/763 |
| 7,096,407 B2 * | 8/2006 | Olarig | G06F 11/108 714/768 |
| 7,650,558 B2 | 1/2010 | Rosenbluth et al. | |
| 8,640,005 B2 * | 1/2014 | Wilkerson | G06F 11/1064 714/763 |
| 2007/0234182 A1 | 10/2007 | Wickeraad et al. | |
| 2008/0229176 A1 | 9/2008 | Arnez et al. | |
| 2009/0249169 A1 | 10/2009 | Bains et al. | |
| 2010/0257432 A1 | 10/2010 | Resnick | |
| 2012/0054580 A1 | 3/2012 | Sakaue | |
| 2013/0132797 A1 | 5/2013 | Arai | |
| 2014/0211579 A1 | 7/2014 | Lovelace | |
| 2014/0337688 A1 | 11/2014 | Billing et al. | |
| 2015/0067437 A1 | 3/2015 | Bains et al. | |

OTHER PUBLICATIONS

International Search Report and Written Opinion for PCT Patent Application No. PCT/US2016/045640, dated Nov. 14, 2016, 13 pages.

International Search Report and Written Opinion for PCT Patent Application No. PCT/US2016/045643, dated Nov. 16, 2016, 15 pages.

* cited by examiner

MEMORY DEVICE ON-DIE ERROR CHECKING AND CORRECTING CODE

RELATED APPLICATIONS

This patent application is a nonprovisional application based on U.S. Provisional Application No. 62/211,448, filed Aug. 28, 2015. This application claims the benefit of priority of that provisional application. The provisional application is hereby incorporated by reference.

The present patent application is related to the following two patent applications, which also claim priority to the same U.S. Provisional Application identified above: patent application Ser. No. 14/998,059, entitled "MEMORY DEVICE CHECK BIT READ MODE"; and, patent application Ser. No. 14/998,184, entitled "MEMORY DEVICE ERROR CHECK AND SCRUB MODE AND ERROR TRANSPARENCY"; both filed concurrently herewith.

FIELD

The descriptions are generally related to memory error management, and more particular descriptions are related to error checking and correction in a memory subsystem with a memory device that performs internal error checking and correction.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Computing devices require storage for data and code to be executed. Temporary storage traditionally provides faster access to data for execution, and traditional temporary storage is implemented with volatile memory resources. Volatile memory finds use in current computing platforms, whether for servers, desktop or laptop computers, mobile devices, and consumer and business electronics. DRAM (dynamic random access memory) devices are the most common types of volatile memory devices in use. As the manufacturing processes to produce DRAMs continue to scale to smaller geometries, DRAM errors are projected to increase. One technique for addressing the increasing DRAM errors is to employ on-die ECC (error checking and correction). On-die ECC refers to error detection and correction logic that resides on the memory device itself. With on-die ECC logic, a DRAM can correct single bit failures, such as through a single error correction (SEC). On-die ECC can be used in addition to system level ECC, but the system level ECC has no insight into what error correction has been performed at the memory device level. Thus, while on-die ECC can handle errors inside a memory device, errors can accumulate undetected by the host system.

In general, error detection and/or correction can vary from the lowest levels of protection (such as parity) to more complex algorithmic solutions (such as double-bit error correction). Parity error generation and checking is fast, and can indicate an error in a long string with a single parity bit, but it provides no correction capability. Double-bit error correction requires more resources (time and code store) to implement, which may not be feasible for on-die ECC in memory devices in high-speed, high-bandwidth applications. While stronger codes provide better error detection and correction, there is a tradeoff with computation time and resources that favors weaker codes in on-die ECC implementations.

In systems that employ SEC, such as DRAMs implementing on-die SEC, the ECC can correct a single bit error (SBE). However, a double bit error can be interpreted and "corrected" as an SBE. The miscorrection of a double bit error as an SBE can actually create a triple bit error in a code word half by toggling a third bit due to misinterpreting the double bit error as an error at a bit indicated by an SEC code. However, given that more complex ECC requires more computation time and resources, it may not be practical to implement stronger on-die ECC.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
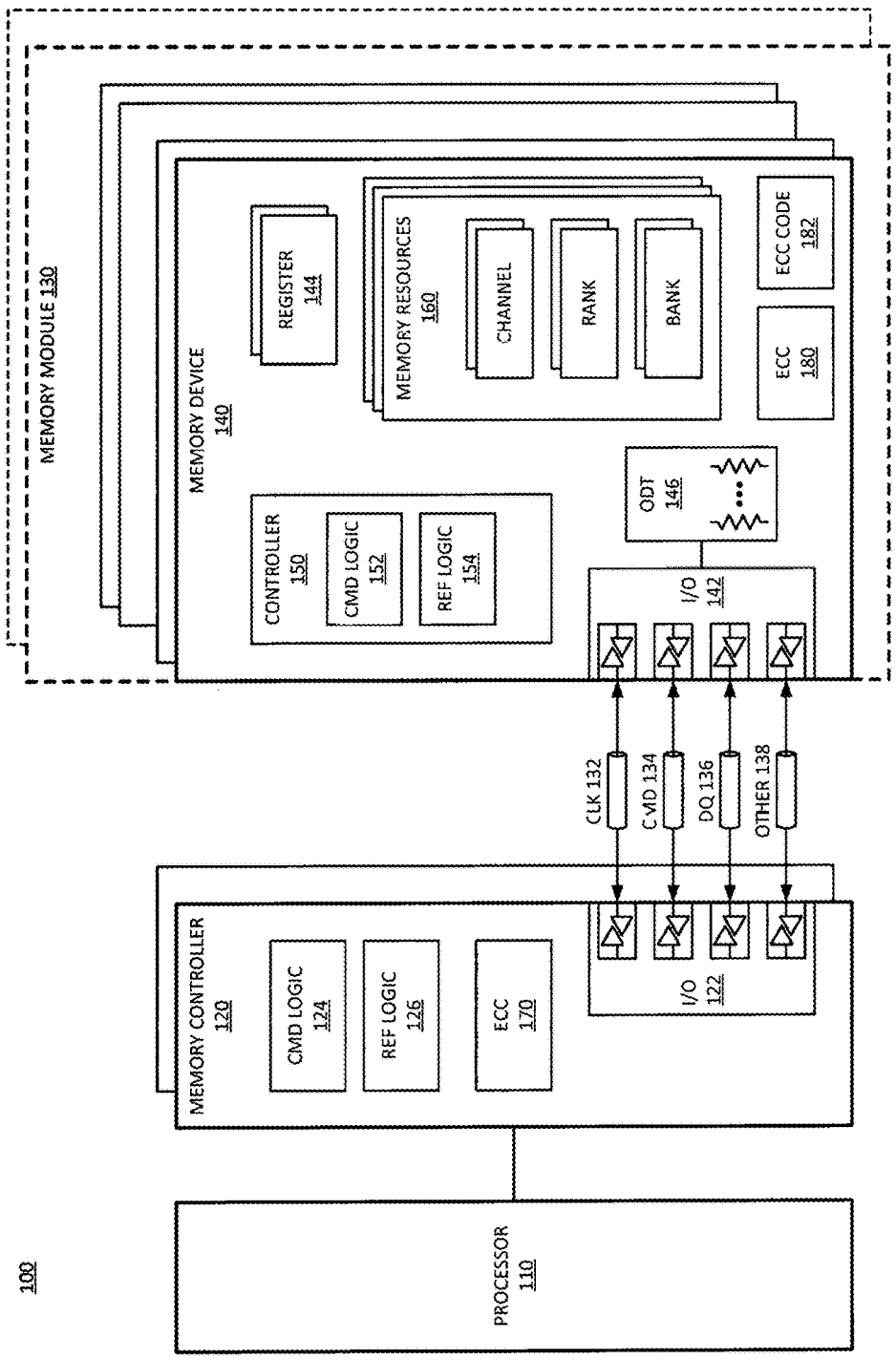
FIG. 1 is a block diagram of an embodiment of a system in which a memory device performs ECC with a code matrix that prevents a two bit error from being changed into a three bit error in a code word half.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, an on-memory application of error correction includes an error correction code that prevents double bit errors from being aliased or miscorrected into a triple bit error in a single code word half. Aliasing a double bit error can refer to interpreting errors at two separate bit locations of a code word as an error at a different, third bit based on the error computation. Thus, when a double-bit error exists in a system that performs error correction on single errors, the error correction computations can interpret the double bit error as a single error in a third location, causing the system to improperly toggle the third bit in an attempt to correct an identified error. In a system where a memory device performs on-die ECC, the ECC operates on N-bit code words or data words as two (N/2)-bit segments. By separating the code into two segments, the memory device can perform SBE (single bit error) correction on the whole word while checking both segments separately for double bit errors. The ECC performs computations based on a code matrix that includes N codes corresponding to the N bits of the data word. The codes can be operated on as a first portion of (N/2) codes and a second portion of (N/2) codes to compute first and second error checks for first and second (N/2)-bit segments of the data word, respectively.

In the code matrix, every code in a portion has a property that a bitwise XOR (exclusive OR) of any two adjacent codes in the first portion of the code matrix or any two adjacent codes in the second portion of the code matrix results in a code that is either not in the code matrix or is in the other portion of the code matrix. A bitwise XOR is understood to be an XOR of corresponding adjacent bits, and not an XOR or cascade of XORs of all bits. Thus, a bitwise XOR of adjacent codes will result in a code of the same length, rather than a single value. Seeing that the XOR function is commutative, an XOR result of any multiple codes results in the same output no what order the codes are XORed together. Thus, a code matrix as described herein is thus constructed where if an XOR of any adjacent rows results in a code either not in the matrix or in the other portion of the matrix, an XOR of any two rows or any two codes in the first portion will point to a code in the second portion (or not in the matrix), and vice versa. Thus, double bit errors will result in two codes showing errors, and result in the equivalent of an XOR of the two codes, which will either not be in the code matrix or will point to a bit in the other portion. Thus, a double bit error cannot point to a bit in the same portion, but can only point to a bit in the other portion. Miscorrecting the bit will occur in the other portion. Thus, a miscorrected double bit error in one portion causes a bit to be toggled in the other portion instead of creating a triple bit error. The end result of the SEC ECC operation will be to correct SBEs, create an error in the other portion, or generate a code that does not exist (is not in the code matrix) and thus detects an error without correcting an error. Thus, the memory device will either return correct data, or return data with a detected, but uncorrected error.

In one embodiment, such error correction with the codes referred to above can be implemented in a DRAM or other memory device. Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "DRAM" can apply to any memory device that allows random access, whether volatile or nonvolatile. The memory device or DRAM can refer to the die itself and/or to a packaged memory product.

DDR4E SDRAM devices are planned to implement internal single error correction (SEC or single-bit error correction) ECC (error checking and correction) to mitigate refresh failures and improve data integrity within the DRAM. Consider an example of on-die ECC in DDR4E DRAMs that use 128 data bits and 8 ECC check bits. In one embodiment, in accordance with what is described herein, for purposes of the ECC code matrix, the 128 data bits are considered in two code word halves, a top 64 bits and a bottom 64 bits. The codes in a code matrix correspond to bits in the data word, which can also be referred to as the code word. When considering the data word or code word as two separate halves, the code matrix can be considered as two separate halves or segments of codes, with a top half (e.g., 64 codes) corresponding to the top 64 bits, and a bottom half (e.g., 64 codes) corresponding to the bottom 64 bits. More detail is provided below with respect to various examples and embodiments described. It will be understood that reference to DDR4E, and to code words of 128 bits and code matrices of 128 codes is simply one example, and different size code words and code matrices can be used. In one embodiment, 8 check bits corresponds to a 128 bit code word (e.g., a (128,136) Hamming code), and use of a different code word size can correspond to a different number of check bits.

In one embodiment, an N-bit code matrix considered in two portions or groups of (N/2) bits each can be defined to prevent generating three bit errors from two bit errors in a single code word half. The codes correspond to a specific data bit (e.g., code[1] corresponds to data word bit[1]). In one embodiment, every code indicates an error in its corresponding bit (based on an XOR operation with the check bits). However, double bit errors will result in generation of a code that points to the other half of the data word. Thus, for example, an XOR of any two codes [127:64] corresponds to one of codes [63:0] or a code not in the code matrix, and an XOR of any two codes [63:0] corresponds to one of codes [127:64] or a code not in the code matrix. Thus, double bit errors in one portion will result in either not toggling a bit, or toggling a bit from the corresponding other portion of the data word, instead of toggling a bit in the same portion, which can cause a triple bit error in a single portion.

The described code is defined to make a correction in the other half of the word, so if a double bit error occurs, it will be identified as a single bit error and an attempt made to correct it. Such a code can enable better operation between memory device ECC and system-wide ECC. A traditional code that could result in a triple bit error could result in data being sent from the memory device to the host, without the host having a possibility to correct the error. In one embodiment, the host can implement ECC that enables correction of double bit errors. Thus, detected but uncorrected errors may be correctable at the host, but not if they are turned into triple bit errors in an attempt to correct double bit error. In this way, the memory device can perform on-die ECC and send the data to the host without needing to expose internal ECC information, while still allowing the host to improve the system RAS (reliability, accessibility, and serviceability). Thus, such an ECC implementation with internal ECC codes as described can be considered to alias double-bit error miscorrection to the other half of the data word instead of aliasing to a third bit in the same half of the data word.

FIG. 1 is a block diagram of an embodiment of a system in which a memory device performs ECC with a code matrix that prevents a two bit error from being changed into a three bit error in a code word half. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single and/or a multicore processing unit. The processing unit can be a primary processor such as a CPU (central processing unit) and/or a peripheral processor such as a GPU (graphics processing unit). System 100 can be implemented as an SOC, or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAMs in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. In one embodiment, settings for each channel are controlled by separate mode register or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a system bus. I/O interface logic 122 (as well as I/O 142 of memory device 140) can include pins, connectors, signal lines, and/or other hardware to connect the devices. I/O interface logic 122 can include a hardware interface. As illustrated, I/O interface logic 122 includes at least drivers/transceivers for signal lines. Typically, wires within an integrated circuit interface with a pad or connector to interface to signal lines or traces between devices. I/O interface logic 122 can include drivers, receivers, transceivers, termination, and/or other circuitry to send and/or receive signal on the signal lines between the devices. The system bus can be implemented as multiple signal lines coupling memory controller 120 to memory devices 140. The system bus includes at least clock (CLK) 132, command/address (CMD) 134, data (DQ) 136, and other signal lines 138. The signal lines for CMD 134 can be referred to as a "C/A bus" (or ADD/CMD bus, or some other designation indicating the transfer of commands and address information) and the signal lines for DQ 136 be referred to as a "data bus." In one embodiment, independent channels have different clock signals, C/A buses, data buses, and other signal lines. Thus, system 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

It will be understood that the system bus includes a data bus (DQ 136) configured to operate at a bandwidth. Based on design and/or implementation of system 100, DQ 136 can have more or less bandwidth per memory device 140. For example, DQ 136 can support memory devices that have either a x32 interface, a x16 interface, a x8 interface, or other interface. The convention "xN," where N is a binary integer refers to an interface size of memory device 140, which represents a number of signal lines DQ 136 that exchange data with memory controller 120. The interface size of the memory devices is a controlling factor on how many memory devices can be used concurrently per channel in system 100 or coupled in parallel to the same signal lines.

Memory devices 140 represent memory resources for system 100. In one embodiment, each memory device 140 is a separate memory die, which can include multiple (e.g., 2) channels per die. Each memory device 140 includes I/O interface logic 142, which has a bandwidth determined by the implementation of the device (e.g., x16 or x8 or some other interface bandwidth), and enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140, and the memory modules can include support for multiple separate channels to the included memory devices disposed on them.

Memory devices 140 each include memory resources 160. Memory resources 160 represent individual arrays of memory locations or storage locations for data. Typically memory resources 160 are managed as rows of data, accessed via cacheline (rows) and bitline (individual bits within a row) control. Memory resources 160 can be organized as separate channels, ranks, and banks of memory. Channels are independent control paths to storage locations within memory devices 140. Ranks refer to common locations across multiple memory devices (e.g., same row addresses within different devices). Banks refer to arrays of memory locations within a memory device 140. In one embodiment, banks of memory are divided into sub-banks with at least a portion of shared circuitry (e.g., drivers, signal lines, control logic) for the sub-banks.

In one embodiment, memory devices 140 include one or more registers 144. Registers 144 represent storage devices or storage locations that provide configuration or settings for the operation of the memory device. In one embodiment, registers 144 can provide a storage location for memory device 140 to store data for access by memory controller 120 as part of a control or management operation. In one embodiment, registers 144 include one or more Mode Registers. In one embodiment, registers 144 include one or more multipurpose registers. The configuration of locations within register 144 can configure memory device 140 to operate in different "mode," where command and/or address information or signal lines can trigger different operations within memory device 140 depending on the mode. Settings of register 144 can indicate configuration for I/O settings (e.g., timing, termination or ODT (on-die termination), driver configuration, and/or other I/O settings.

In one embodiment, memory device 140 includes ODT 146 as part of the interface hardware associated with I/O 142. ODT 146 can be configured as mentioned above, and provide settings for impedance to be applied to the interface to specified signal lines. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the access and/or execution of operations for memory resources 160 based on the selected mode. Controller 150 generates control signals to control the routing of bits within memory device 140 to provide a proper interface for the selected mode and direct a command to the proper memory locations or addresses.

Referring again to memory controller 120, memory controller 120 includes command (CMD) logic 124, which represents logic or circuitry to generate commands to send to memory devices 140. Typically, the signaling in memory subsystems includes address information within or accompanying the command to indicate or select one or more memory locations where the memory devices should execute the command. In one embodiment, controller 150 of memory device 140 includes command logic 152 to receive and decode command and address information received via I/O 142 from memory controller 120. Based on the received command and address information, controller 150 can control the timing of operations of the logic and circuitry within memory device 140 to execute the commands. Controller 150 is responsible for compliance with standards or specifications.

In one embodiment, memory controller 120 includes refresh (REF) logic 126. Refresh logic 126 can be used where memory devices 140 are volatile and need to be refreshed to maintain a deterministic state. In one embodiment, refresh logic 126 indicates a location for refresh, and a type of refresh to perform. Refresh logic 126 can trigger self-refresh within memory device 140, and/or execute external refreshes by sending refresh commands. For example, in one embodiment, system 100 supports all bank refreshes as well as per bank refreshes, or other all bank and per bank commands. All bank commands cause an operation of a selected bank within all memory devices 140 coupled in parallel. Per bank commands cause the operation of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory controller 120 includes error correction and control logic 170 to perform system-level ECC for system 100. System-level ECC refers to application of error correction at memory controller 120, and can apply error correction to data bits from multiple different memory devices 140. ECC 170 represents circuitry or logic to enable system-level ECC operations, such as double bit error correction.

In one embodiment, memory device 140 includes internal ECC 180, which can also be referred to as on-die ECC. In one embodiment, internal ECC 180 represents SEC ECC logic within memory device 140. In one embodiment, ECC 180 operates on internal ECC code 182, which represents a code matrix having codes where an XOR of any two codes in one portion of the code matrix results in a code that is either not in code 182, or is in the other portion of the code matrix.

In one embodiment, memory devices 140 include DDR4E SDRAM devices. Such DRAMs can have different interfaces, as mentioned above. For an example of a memory device 140 that is a DDR4E SDRAM with a x4 or a x8 interface, the internal prefetch of data within memory resources 160 is 128 bits, even though x8 is a 64 bit prefetch device and a x4 device is a 32 bit prefetch device. Thus, in one embodiment, memory device 140 prefetches more data than defined for the interface type. In one embodiment, for each read or write transaction in a x8 device (or a device with a x8 interface), an additional section of the DRAM array is accessed internally to provide the required additional 64 bits used in the 128 bit ECC computation. Thus, in an x8 device, each 8 ECC check bits (or ECC check bit word) can be tied to two 64 bit sections of the DRAM, such as described below with respect to FIG. 3B. Following a similar example for the case of a x4 device, each 8 ECC bits can be tied to four 32 bit columns in a row, such as described below with respect to FIG. 3A. For a similar example referring to a x16 device, no additional prefetch is required as the prefetch is the same as the external transfer size, although the prefetch may be accessed from different bank groups, such as described below with respect to FIG. 3C.

In one embodiment, memory device 140 corrects any single bit errors with ECC 180 and ECC code 182 prior to returning the data to memory controller 120. In one embodiment, memory device 140 will not write the corrected data back to the array during a read cycle. ECC code 182 is encoded for a case of an aliased triple bit error resulting in the third error appearing in the opposite half of the data word as the double bit error.

Figure 2:
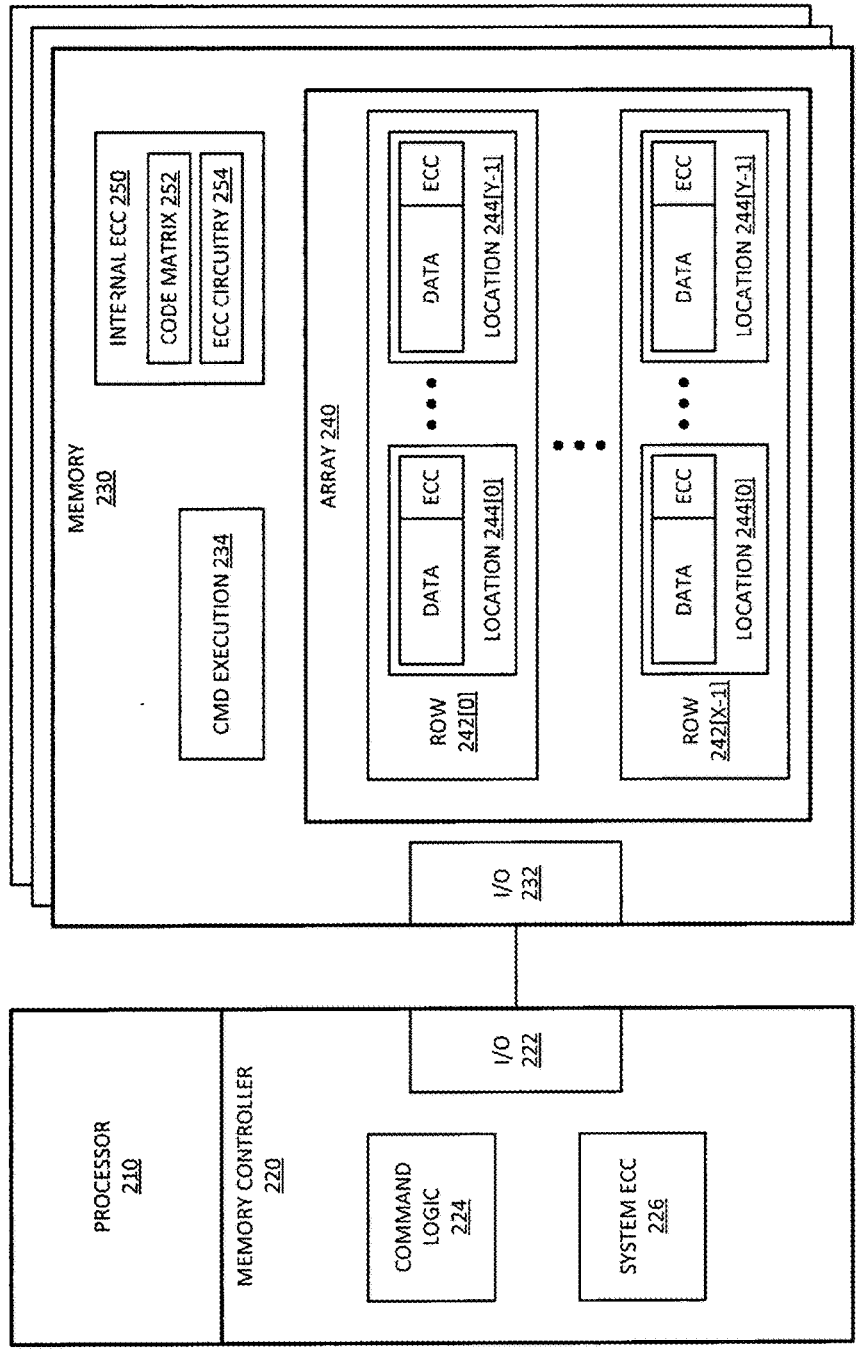
FIG. 2 is a block diagram of an embodiment of a system with a memory device that performs internal error correction with a code matrix that prevents a two bit error from being changed into a three bit error in a code word half.

FIG. 2 is a block diagram of an embodiment of a system with a memory device that performs internal error correction with a code matrix that prevents a two bit error from being changed into a three bit error in a code word half. System 200 represents components of a memory subsystem. System 200 provides one example of a memory subsystem in accordance with an embodiment of system 100 of FIG. 1. System 200 can be included in any type of computing device or elecironic circuit that uses memory with internal ECC, where the internal ECC includes a code matrix to alias a double-bit error miscorrection to a portion of the data word that does not result in a triple bit error.

Processor 210 represents any type of processing logic or component that executes operations based on data stored in memory 230 or to store in memory 230. Processor 210 can be or include a host processor, central processing unit (CPU), microcontroller or microprocessor, graphics processor, peripheral processor, application specific processor, or other processor. Processor 210 can be or include a single core or multicore circuit. Memory controller 220 represents logic to interface with memory 230 and manage access to data of memory 230. As with the memory controller above, memory controller 220 can be separate from or part of processor 210. Processor 210 and memory controller 220 together can be considered a "host" from the perspective of memory 230, and memory 230 stores data for the host. In one embodiment, memory 230 includes DDR4E DRAMs that have internal ECC (which may be referred to in the industry as DDR4E devices). In one embodiment, system 200 includes multiple memory resources 230. Memory 230 can be implemented in system 200 in any type of architecture that supports access via memory controller 220 with use of internal ECC in the memory. Memory controller 220 includes I/O (input/output) 222, which includes hardware resources to interconnect with corresponding I/O 232 of memory 230.

Memory controller 220 includes command logic 224, which represents control logic with the host to issue commands to memory 230. The commands can include data access commands and/or control commands. Command logic 224 can send commands and data via I/O 222, and receive data from I/O 232. In one embodiment, memory controller 220 includes system ECC logic 226, which represents logic within the host to perform ECC. System-level ECC 226 represents ECC that can use data from multiple parallel memory devices 230 to provide higher-level ECC. In one embodiment, system ECC 226 can spread errors across multiple parallel resources. By spreading errors across multiple resources, memory controller 220 can recover data even in the event of one or more failures in memory 230. Memory failures are generally categorized as either soft errors or soft failures, which are transient bit errors typically resulting from random environmental conditions, or hard errors or hard failures, which are non-transient bit errors occurring as a result of a hardware failure.

In one embodiment, system ECC 226 operates on metadata provided from internal ECC at memory 230. Memory 230 includes command execution 234, which represents control logic within the memory device to receive and execute commands from memory controller 220. The commands can include a series of ECC operations for the memory device to perform. In one embodiment, memory 230 performs internal ECC independent of a specific ECC command or request from the host. For example, memory 230 can perform ECC in response to a read command.

Memory 230 includes array 240, which represents the array of memory locations where data is stored in the memory device. In one embodiment, each address location 244 of array 240 includes associated user data and ECC bits. In one embodiment, address locations 244 represent addressable chunks of data, such as 128-bit chunks, 64-bit chunks, or 256-bit chunks. In one embodiment, address locations 244 are organized as segments or groups of memory locations. For example, as illustrated, memory 230 includes multiple rows 242. In one embodiment, each row 242 is a segment or a portion of memory that is checked for errors. In one embodiment, rows 242 correspond to memory pages or wordlines. Array 240 includes X rows 242, and rows 242 include Y memory locations 244. It will be understood that the organization of rows 242, locations 244, and data and ECC bits do not necessarily imply a physical layout of the bits in array 240, but illustrate one example of an understanding of the addressability of the data bits.

In one embodiment, address locations 244 correspond to memory words, and rows 242 correspond to memory pages. A page of memory refers to a granular amount of memory space allocated for a memory access operation. In one embodiment, array 240 has a larger page size to accommodate the ECC bits in addition to the data bits. Thus, a normal page size would include enough space allocated for the data bits, and array 240 allocates enough space for the data bits plus the ECC bits.

In one embodiment, memory 230 includes internal ECC logic 250. Internal ECC 250 includes circuitry 254 to perform error checking and correction. For example, ECC circuitry 254 can include XOR circuits to generate check bits from input data words, and generate syndromes from fetched data words and corresponding ECC check bits. Internal ECC 250 includes code matrix 252, which can be or include an ECC H-matrix. A code matrix refers to matrix having a length of a data word to be checked for errors, where each code is a column of size equal to a number of check bits for the type of ECC coding. For example, a code matrix for (128,136) Hamming has 128 rows of 8-bit codes.

Consider the length of the data words of locations 244 to be N bits. Thus, system 200 can be said to have array 240 that stores N-bit data words, and ECC bits associated with the data words. Code matrix 252 can represents a code store within memory 230 where the codes for ECC are stored. The code store can include one or more reserved memory locations 244, or other storage dedicated for the code matrix. Code matrix 252 includes N codes, which correspond to the N bits of the data words. In one embodiment, the data word is checked as two segments of N/2 bits each, with corresponding (N/2)-bit code portions. In one embodiment, ECC circuitry 254 performs internal ECC based on the code word (the data word) and the associated ECC bits. Based on a check value or syndrome generated from an ECC computation on the data word and ECC bits, internal ECC 250 can identify a code of code matrix 252 to determine which bit of the data word to correct, or identifies a code that is not in code matrix 252 to determine there is an error, but does not correct the error. Thus, ECC circuitry 254 can be said to compute first and second error checks for first and second (N/2)-bit segments of the data word, respectively, based on the first and second portions of code matrix 252, respectively.

Code matrix 252 represents a code matrix as described herein, where a bitwise XOR of any two codes in the first portion of the code matrix generates a code that is either not in code matrix 252 or is in the second portion of the code matrix. Likewise, a bitwise XOR of any two codes in the second portion of the code matrix generates a code that is either not in code matrix 252 or is in the first portion of the code matrix. Thus, internal ECC 250 prevents double bit errors from being aliased into a triple bit error by incorrectly toggling a correct bit value.

In one embodiment, system ECC 226 includes a test mode for testing code matrix 252. For example, system ECC 226 can perform certain ECC operations if code matrix 252 is a code matrix as described herein that prevents double bit errors from becoming triple bit errors due to miscorrection. If code matrix 252 is not such a code matrix, system ECC 226 can operate differently, knowing that some returned data could include three errors when no error is indicated. Such a test mode can include sending "poisoned" data to memory 230, which is data designed to test code matrix 252. In one embodiment, in such a test mode, memory controller 220 can write ECC bits to one or more locations 244, and then request a read of those locations. Knowing what data and what ECC bits were being used for internal ECC 250, if memory 230 returns unexpected data to memory controller 220, the memory controller can determine that code matrix 252 does not comply with the code matrix type described herein.

Figure 3A:
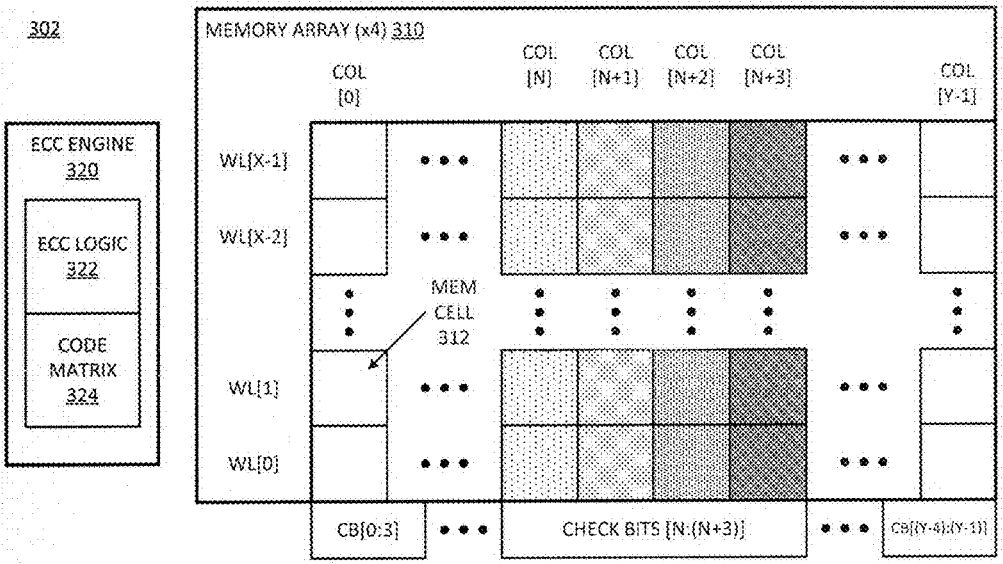
FIG. 3A is a block diagram of an embodiment of a memory device having a 4 bit interface that performs internal ECC.

FIG. 3A is a block diagram of an embodiment of a memory device having a 4 bit interface that performs internal ECC. Memory device 302 represents one example of an embodiment of memory 140 of FIG. 1 and/or an embodiment of memory 230 of FIG. 2. Memory device 302 represents a x4 memory device. Memory device 302 includes memory array 310, which can include X wordlines (WL) and Y columns (COL). Thus, each wordline is Y memory cells 312 wide, and each column is X memory cells 312 high. It will be understood that while not specifically shown, memory array 310 includes wordline drivers, bitline drivers, sensing circuits, holding capacitors, switches, and/or other circuitry to read and/or write individual memory cells 312.

Memory device 302 includes ECC engine 320, which represents internal ECC for the memory device. ECC engine 320 includes ECC logic or circuitry 322 to perform ECC computations in memory device 302. ECC engine 320 includes or accesses code matrix 324 (which is stored in a code store of memory device 302). Code matrix aliases third bit errors due to error correction of double bit errors from one half of the code word to the other half, in accordance with any embodiment described herein.

In one embodiment, for a x4 device, a single complete code word is four column accesses. Memory array 310 is illustrated in a way to represent that relationship between column accesses and code words or data words for purposes of ECC. Thus, check bits can correspond to multiple columns of memory array 310. As a result, each check bit word can apply to multiple columns of data (e.g., four). The codes in a code matrix can provide correction information across multiple columns.

For example, a first code bit word will include check bits that apply to columns [0:3]. Thus, memory array 310 has a code word divided into four column accesses: N, N+1, N+2, and N+3. In one embodiment, the top code word half is mapped to the N and N+1 column accesses, and the bottom code word half is mapped to the N+2 and N+3 column accesses. Check bits [N:(N+3)] represent the check bits for that code word. In one embodiment, check bits are stored in check bits wordlines at the bottom of the columns, but such a configuration is only one example, and the check bits can be stored in other locations within memory array 310.

In one embodiment, ECC logic 322 performs operations on the code word with columns N and N+1 corresponding to a top half of code matrix 324 and with columns N+2 and N+3 corresponding to a bottom half of code matrix 324. Code matrix 324 includes codes that, with such a mapping, will cause any two bit errors occurring in N+N+1 that might be aliased to a three bit error to show up in N+2+N+3, and likewise any two bit errors occurring in N+2+N+3 that might be aliased to a three bit error to show up in N+N+1.

Figure 3B:
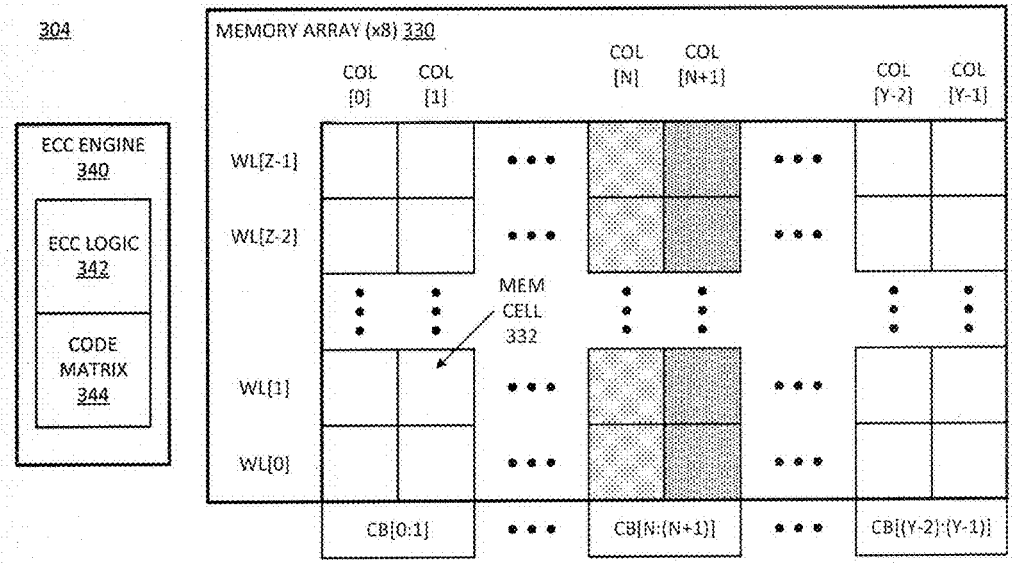
FIG. 3B is a block diagram of an embodiment of a memory device having an 8 bit interface that performs internal ECC.

FIG. 3B is a block diagram of an embodiment of a memory device having an 8 bit interface that performs internal ECC. Memory device 304 represents one example of an embodiment of memory 140 of FIG. 1 and/or an embodiment of memory 230 of FIG. 2. Memory device 304 represents a x8 memory device. Memory device 304 includes memory array 330, which can include Z wordlines (WL) and Y columns (COL). Thus, each wordline is Y memory cells 332 wide, and each column is Z memory cells 332 high. It will be understood that while not specifically shown, memory array 330 includes wordline drivers, bitline drivers, sensing circuits, holding capacitors, switches, and/or other circuitry to read and/or write individual memory cells 332. In one embodiment, the Y columns of memory array 330 are a different number of columns from the Y columns of memory array 310 of memory device 302. In one embodiment, the number of wordlines Z in memory array 330 is different from the number X of wordlines of memory array 310 of memory device 302. In one embodiment, the number of wordlines Z in memory array 330 is the same as the number X of wordlines of memory array 310 of memory device 302.

Memory device 304 includes ECC engine 340, which represents internal ECC for the memory device. ECC engine 340 includes ECC logic or circuitry 342 to perform ECC computations in memory device 304. ECC engine 340 includes or accesses code matrix 344 (which is stored in a code store of memory device 304). Code matrix aliases third bit errors due to error correction of double bit errors from one half of the code word to the other half, in accordance with any embodiment described herein.

In one embodiment, for a x8 device, a single complete code word is two column accesses. Memory array 330 is illustrated in a way to represent that relationship between column accesses and code words or data words for purposes of ECC. Thus, check bits can correspond to multiple columns of memory array 330. As a result, each check bit word can apply to multiple columns of data (e.g., two). The codes in a code matrix can provide correction information across multiple columns.

For example, a first code bit word will include check bits that apply to columns [0:1]. Thus, memory array 330 has a code word divided into two column accesses: N and N+1. In one embodiment, the top code word half is mapped to the N column access and the bottom code word half is mapped to the N+1 column access. Check bits [N:(N+1)] represent the check bits for that code word. In one embodiment, check bits are stored in check bits wordlines at the bottom of the columns, but such a configuration is only one example, and the check bits can be stored in other locations within memory array 330.

In one embodiment, ECC logic 342 performs operations on the code word with column N corresponding to a top half of code matrix 344 and with column N+1 corresponding to a bottom half of code matrix 344. Code matrix 344 includes codes that, with such a mapping, will cause any two bit errors occurring in N that might be aliased to a three bit error to show up in N+1, and likewise any two bit errors occurring in N+1 that might be aliased to a three bit error to show up in N.

Figure 3C:
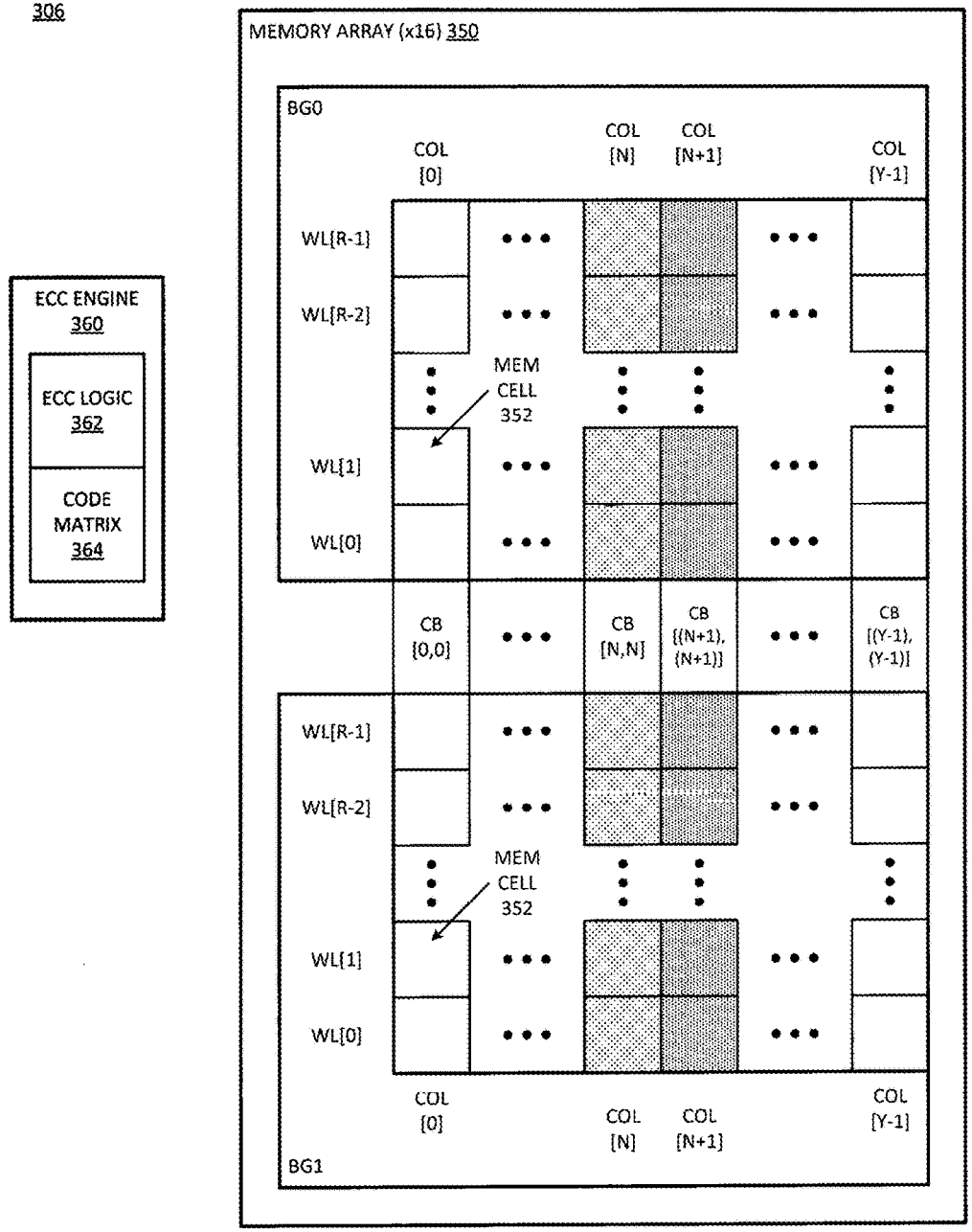
FIG. 3C is a block diagram of an embodiment of a memory device having a 16 bit interface that performs internal ECC.

FIG. 3C is a block diagram of an embodiment of a memory device having a 16 bit interface that performs internal ECC. Memory device 306 represents one example of an embodiment of memory 140 of FIG. 1 and/or an embodiment of memory 230 of FIG. 2. Memory device 306 represents a x16 memory device. Memory device 306 includes memory array 350, which can include R wordlines (WL) and Y columns (COL). Thus, each wordline is Y memory cells 352 wide, and each column is R memory cells 352 high. It will be understood that while not specifically shown, memory array 350 includes wordline drivers, bitline drivers, sensing circuits, holding capacitors, switches, and/or other circuitry to read and/or write individual memory cells 352. In one embodiment, the Y columns of memory array 350 are a different number of columns from the Y columns of memory array 310 of memory device 302 or memory array 330 of device 304. In one embodiment, the number of wordlines R in memory array 350 is different from the number X of wordlines of memory array 310 of memory device 302 and/or from the number Z of wordlines of memory array 330. In one embodiment, the number of wordlines R in memory array 350 is the same as the number X of wordlines of memory array 310 of memory device 302 and/or the same as the number Z of wordlines of memory array 330.

Memory device 306 includes ECC engine 360, which represents internal ECC for the memory device. ECC engine 360 includes ECC logic or circuitry 362 to perform ECC computations in memory device 306. ECC engine 360 includes or accesses code matrix 364 (which is stored in a code store of memory device 306). Code matrix aliases third bit errors due to error correction of double bit errors from one half of the code word to the other half, in accordance with any embodiment described herein.

In one embodiment, for a x16 device, a single complete code word is single column access. Memory array 350 is illustrated in a way to represent that relationship between column accesses and code words or data words for purposes of ECC. In one embodiment, check bits can correspond to multiple columns of memory array 350, but from different bank groups BG0 and BG1. For example, a first code bit word will include check bits that apply to column [0] of both BG0 and BG1. Thus, memory array 350 has a code word from a single column access: column N from BG0 and column N from BG1. In one embodiment, the top code word half is mapped to the column access from BG0 and the bottom code word half is mapped to the column access from BG1. Check bits [N,N] represent the check bits for the code word. In one embodiment, check bits are stored in check bit wordlines at the bottom of the columns, but such a configuration is only one example, and the check bits can be stored in other locations within memory array 350.

In one embodiment, ECC logic 362 performs operations on the code word with column N of BG0 corresponding to a top half of code matrix 364 and with column N of BG1 corresponding to a bottom half of code matrix 364. Code matrix 364 includes codes that, with such a mapping, will cause any two bit errors occurring in one half that might be aliased to a three bit error to show up in the other half.

In one embodiment, each of N codes in code matrix 364 provides ECC information for accesses of two separate (N/2)-bit columns from separate bank groups. Alternatively it can be considered to be an access for a single N-bit column, but from separate groups. In one embodiment, ECC engine 360 performs ECC on two segments from separate prefetches, and transmits data to the host from only a one selected segment.

In general, regarding memory devices 302, 304, and 306, in one embodiment, a x4 or a x8 DDR4E device, the internal prefetch is 128 bits even though the x8 device has a 64 bit prefetch device and the x4 device has a 32 bit prefetch. For each read or write transaction in a x8 device, two columns of the memory array are accessed internally to provide the required additional 64 bits used in the 128 bit ECC computation. Thus, in a x8 device, each 8 bit ECC check bit word is tied to two 64 bit sections of memory array 330. In the case of the x4 device, in one embodiment, each 8 ECC check bit word is tied to four 32 bit columns in a row. In one embodiment, for a x16 device, no additional prefetch is required as the prefetch is the same as the external transfer size.

In one embodiment, on reads, a DDR4E DRAM corrects any single bit errors before returning the data to the memory controller. The DRAM will not write the corrected data back to the array during a read cycle. For double bit errors, the ECC code may miscorrect the error into a triple bit error. In the case of the aliased triple bit error, if the double bit error occurs in the top half of the code word, the code is constructed to cause the miscorrection to occur in the bottom half of the code word. And likewise, if a double bit error occurs in the bottom half of the code word, the miscorrection will occur in the top half of the code word.

In one embodiment, on writes, a DDR4E DRAM computes ECC and writes data and ECC bits to the array. If the external data transfer size is smaller than the 128 bit code word (e.g., for x4 and x8 devices), the DRAM can perform an internal "read-modify-write" operation to read extra portions of the array out, modify the group of data, and then write the modified data back with the new data. In one embodiment, the DRAM corrects any single bit errors that result from the internal read before merging the incoming write data. In one embodiment, the DRAM recomputes the ECC check bits before writing data and ECC bits to the array. In the case of a x16 DDR4E, no internal read is required.

Figure 4:
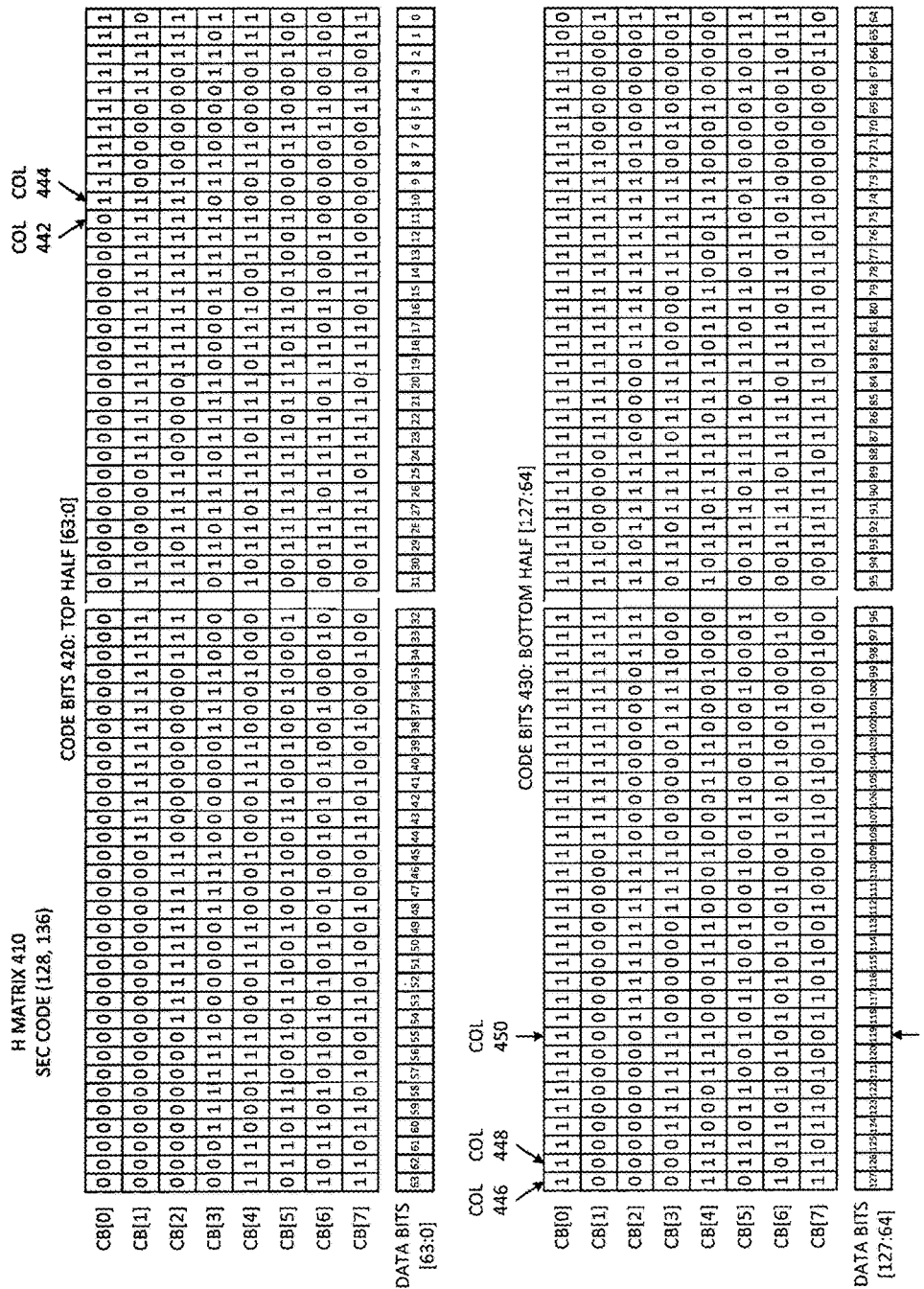
FIG. 4 is a diagrammatic representation of an embodiment of a code matrix that prevents two bit errors for being miscorrected into three bit errors in a code word half.

FIG. 4 is a diagrammatic representation of an embodiment of a code matrix that prevents two bit errors for being miscorrected into three bit errors in a code word half. H matrix 410 represents a code matrix in accordance with an embodiment of any system herein compatible with a 128-bit code word or data word. Matrix 410 can be one embodiment of an SEC Hamming code, specifically, one example of a (128,136) Hamming code. Matrix 410 includes 128 codes, one code bit for each data bit [127:0]. In one embodiment, every code of matrix 420 corresponds to one data bit, as illustrated below. One code includes 8 check bits CB[0:7]. When a syndrome is computed from the data word and check bits stored in the memory, the ECC engine can determine if the syndrome corresponds to one of the codes in matrix 410. If the ECC engine determines a syndrome matches with one of the codes, the ECC engine toggles the corresponding data bit to correct an error.

All codes in matrix 410 are different. In one embodiment, the codes in matrix 410 are separated into different portions, code bits portion 420 and code bits portion 430. In one embodiment, the top half codes (portion 420) correspond to data bits [63:0], and the bottom half codes (portion 430) correspond to data bits [127:64], for two 64-bit portions of a 128-bit code matrix. In one embodiment, XORing adjacent codes of code portion 420 or XORing adjacent codes of code portion 430 results in a code that is either not in matrix 410, or is in the other portion.

For example, consider the bitwise XOR of columns 442 and 444 of portion 420. Column 442 has the bit pattern (01111100) and column 444 has the bit pattern (11100000), and the resulting bitwise XOR of the two columns is (10011100). It will be observed that (10011100) is the bit pattern of column 450, which is a code in portion 430, not portion 420. Further consider the bitwise XOR of columns 446 and 448 of portion 430. Column 446 has a bit pattern (10001011) and column 448 has the bit pattern (10001101), and the resulting bitwise XOR of the two columns is (00000110), which is not found in matrix 410. These are only two examples, and it will be observed that all codes in the portions have the same properties.

A bitwise XOR of any adjacent columns or codes within a portion results in a code that is either not in matrix 410 or is in the other half or portion. Thus, a bitwise XOR of any columns within a portion of the code matrix results in a bit pattern that is either not found in matrix 410 or is found in the other portion. For example, consider the bitwise XOR of column 446 with column 450. The XOR of (10001011)^ (10011100) results in a bit pattern of (00010001), which is not found in code matrix 410.

It will be understood that code matrix 410 represents only one example of a code matrix in accordance with what is described. In one embodiment, matrix 410 can have fewer codes, corresponding to a shorter or longer code word (e.g., fewer or more data bits). The codes can have fewer or more check bits. While the top half (code portion 420) is illustrated as corresponding to data bits [63:0], the top half and the bottom half can be switched in different implementations. Consider an example where computing a syndrome results in the bit pattern of columns 442. Such a case occurs when data bit [11] has an error. Thus, the memory device can toggle data bit [11] to correct the error. Consider now an example where there are errors with both data bit [11] and data bit [10]. In such an example, the resulting syndrome will be the bitwise XOR of columns 442 and 444. If that result was a code in portion 420, the double bit error could be turned into a triple bit error. Instead, in matrix 410, the result of the bitwise XOR of columns 442 and 444 is the code of column 450. Thus, the memory device will toggle data bit [119]. When the data is returned to the host, it can detect and correct the errors in data bit 10, data bit [11], and data bit [119], while it may be unable to correct the errors if another bit within the range of data bits [63:0] was incorrectly toggled in addition to errors being present in data bit [10] and data bit [11]. In one embodiment, the host can correct two bits per half of the data word. In one embodiment, the host can correct two bit errors in one half even and a single bit error in the other half, but not three bit errors in a single half.

While the code matrix is illustrated in the figure, for purposes of completeness, matrix 410 is reproduced here. Again, matrix 410 is one of innumerable examples of code matrices that has the properties described herein. In one example, the top 64 bits [63:0] for the 8-bit codes or check bit words are as follows. For purposes of ease of reading, there is a space located between bit [31] and bit [32] in portion 420, and a space between bit [95] and bit [96] in portion 430. In one embodiment, a memory device with matrix 410 for internal ECC will perform SEC or will correct SBEs detected in the whole word, while checking for double bit errors in each half.

CB[0]=00000000000000000000000000000000
00000000000000000000000011111111111. CB[1]
=00000000000000000000111111111111
11100000111111111111110000011110. CB[2]
=000000001111111111000000000011
11101111000001111111111000000111. CB[3]
=000111110000001110000001111100
001101110111100001111101100001101. CB[4]
=111000111000111000100011100010
010110111011101110011100110000111. CB[5]
=011011001011001001001100100100 0
100111111011101101001001100011000100. CB[6]
=101101010101010010010101010001
000111011110111011001000001100100. CB[7]
=110110100110010001101001001000 10
00011110111101110110000000110011.

For bottom 64 bits [127:64], CB[0]
=1111111111111111111111111111111111
11111111111111111111111111111100. CB[1]
=0000000000000000000111111111111

111000000011111111111111100000001.              CB[2]
=000000001111111110000000000011
110111110000011111111111010000001.              CB[3]
=000111111000000111100000111100
001101111011110000111111001000001.              CB[4]
=111000111000111000100011100100
010110111101110111000111000100000.              CB[5]
=011011001011001001001100100100
100111011110111011011001000010011.              CB[6]
=101101010101010010010101001001
000111101111011101101010000001011.              CB[7]
=110110100110100100001101001010
000111110111101110110100000000110.

Figure 5:
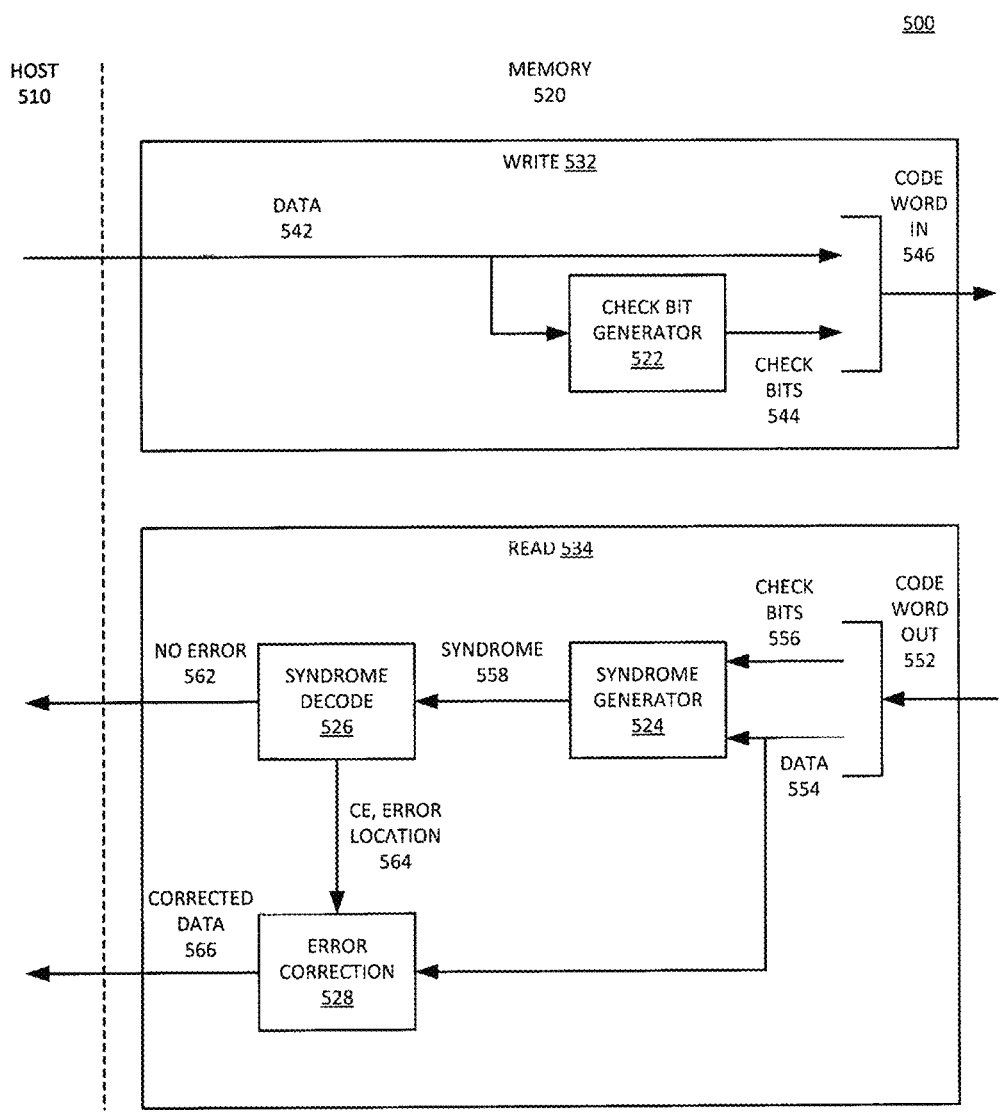
FIG. 5 is a block diagram of an embodiment of ECC logic at a memory device that performs internal ECC.

FIG. 5 is a block diagram of an embodiment of ECC logic at a memory device that performs internal ECC. System 500 is one example of ECC component operation for a memory subsystem with a memory device having internal ECC that applies a code matrix that prevents two bit errors per half of the data word from being aliased into three bit errors in the half, in accordance with an embodiment described herein. System 500 provides an example of internal ECC in a DRAM, which generates and stores internal check bits. Host 510 includes a memory controller or equivalent or alternative circuit or component that manages access to memory 520, and can be integrated on a processor chip (e.g., iMC). Host 510 performs external ECC on data read from memory 520.

System 500 illustrates write path 532 in memory 520, which represents a path for data written from host 510 to memory 520. Host 510 provides data 542 to memory 520 for writing to the memory array(s). In one embodiment, memory 520 generates check bits 544 with check bit generator 522 to store with the data in memory, which can be one example of internal ECC bits used for code word checking/correction. Check bits 544 can enable memory 520 to correct an error that might occur in the writing to and reading from the memory array(s). Data 542 and check bits 544 can be included as code word in 546, which is written to the memory resources. It will be understood that check bits 544 represent internal check bits within the memory device. In one embodiment, there is no write path to check bits 544. In one embodiment, there is a write path to check bits 544 only for purposes of testing the code matrix of memory 520.

Read path 534 represents a path for data read from memory 520 to host 510. In one embodiment, at least certain hardware components of write path 532 and read path 534 are the same hardware. In one embodiment, memory 520 fetches code word out 552 in response to a Read command from host 510. The code word can include data 554 and check bits 556. Data 554 and check bits 556 can correspond, respectively, to data 542 and check bits 544 written in write path 532, if the address location bits of the write and read commands are the same. It will be understood that error correction in read path 534 can include the application of an XOR (exclusive OR) tree to a corresponding H matrix to detect errors and selectively correct errors (in the case of a single bit error).

As is understood in the art, an H matrix refers to a hamming code parity-check matrix that shows how linear combinations of digits of the code word equal zero. In one embodiment, the ECC includes XORing ECC check bits with an identical version generated as the syndrome, which results in zeros. Thus, the H matrix rows can identify the coefficients of parity check equations that must be satisfied for a component or digit to be part of a code word. In one embodiment, memory 520 includes syndrome generator 524 to generate an error vector or syndrome. In one embodiment, check bit generator 522 and syndrome generator 524 are fully specified by a corresponding H matrix for the memory device.

In one embodiment, syndrome generator 524 passes syndrome 558 to syndrome decode 526, which enables the memory to apply check bits 556 to data 554 to detect errors in the read data. Syndrome decode 526 can check syndrome 558 against an ECC code vector or code matrix in accordance with any embodiment described herein. Data 554 can also be forwarded to error correction 528 for correction of a detected error.

In one embodiment, if there are no errors in the read data (e.g., zero syndrome 558), syndrome decode 526 can pass the data to host 510 as no error 562. In one embodiment, if there is a single bit error (e.g., non-zero syndrome 558 that matches one of the columns of the H matrix), syndrome decode 526 can generate a CE (corrected error) signal with error location 564, which is a corrected error indication to error correction logic 528. Error correction 528 can apply the corrected error to the specified location in data 554 to generate corrected data 566 for writing to host 510.

In one embodiment, syndrome decode 526 applies separate functions for the following conditions. In the case of a zero syndrome, syndrome decode 526 can pass no error data 562 to host 510. In the case of a non-zero syndrome that matches one of the columns of the H-matrix, the ECC engine can flip or toggle the corresponding bit to create a corrected error signal (CE). Error correction 528 can perform the actual data correction by changing the identified bit 564. In one embodiment, in the case of a non-zero syndrome that does not match any column, syndrome decode sends the erroneous data to host 510. Corrected data 566 sent from error correction logic 528 is sent when a corresponding code is found in the matrix. In one embodiment, syndrome decode 526 identifies data as detected, uncorrected error (DUE).

Figure 6:
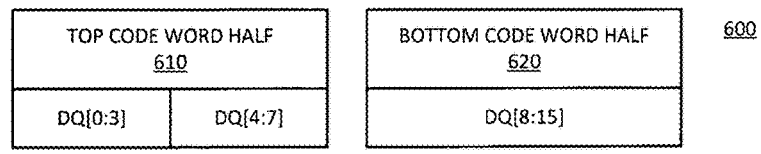
FIG. 6 is a block diagram of an embodiment of a mapping of code words to data bits.

FIG. 6 is a block diagram of an embodiment of a mapping of code words to data bits. Mapping 600 illustrates one embodiment of a code word mapping in accordance with an embodiment of an I/O interface of a memory device that performs internal ECC and utilizes a code matrix in accordance with any embodiment described herein. Whereas FIGS. 3A, 3B, and 3C illustrate a mapping of check bits to data word or code word bits, and FIG. 4 illustrates the mapping of code matrix codes to data bits of the data word, mapping 600 illustrates the I/O mapping for devices of different interface types.

In one embodiment, for a x16 device, top code word half 610 is mapped to DQ[0:7] as one half of a column access, and bottom code word half 620 is mapped to DQ[7:15] as the other half of the column access. A single column access in a x16 device can provide the 16 DQ bits. In one embodiment, for a x8 device, top code word half 610 is mapped to DQ[0:7] as one column access (N) and bottom code word half 620 is mapped to DQ[8:15] as column access N+1. In one embodiment, a x4 device can divide the code word into four column accesses (N, N+1, N+2, N+3), with top code word half 610 mapped to N and N+1, and bottom code word half 620 mapped to N+2 and N+3. With mappings to top code word half 610 and bottom code word half 620, any two bit error occurring in one code word half that might be aliased into a three bit error, will always show up in the other code word half. For example, for a x8 device, for any 2 bit error that occurs in N or N+1 that might be aliased into a 3 bit error in a code word half, the aliased third error will always show up in the other column access (N+1, N).

Figure 7:
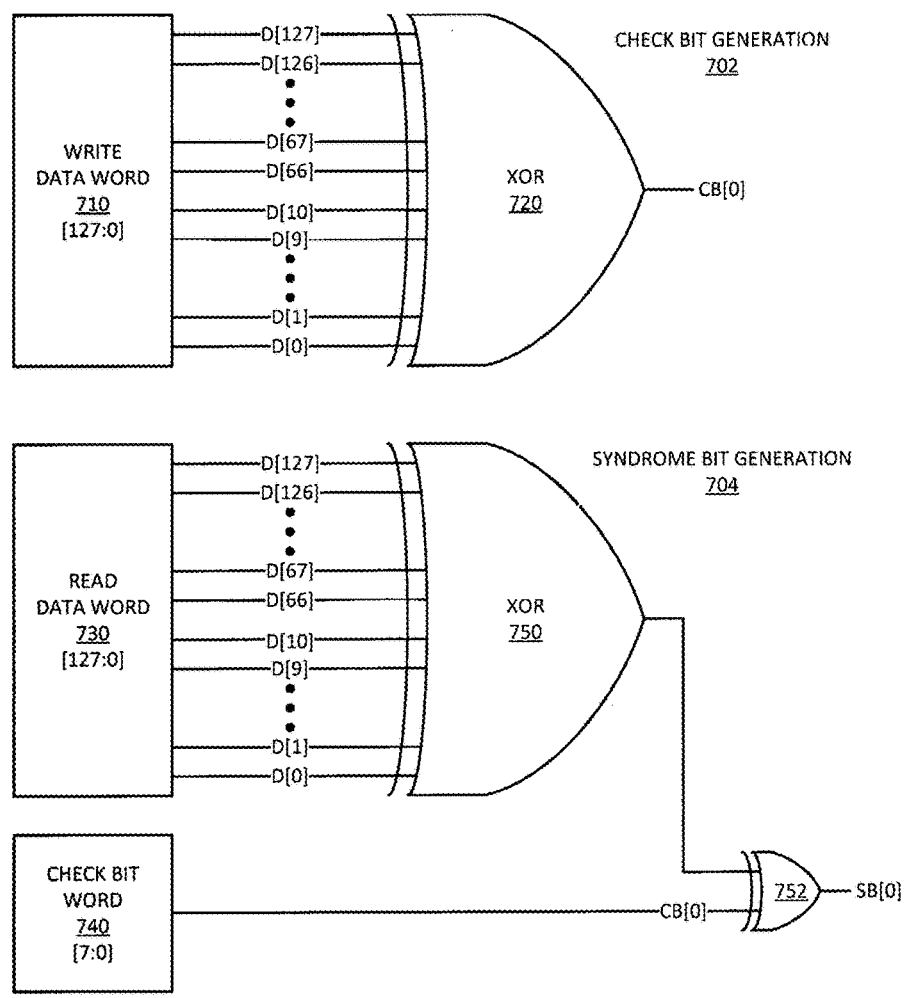
FIG. 7 is a block diagram of an embodiment of check bit generation logic and syndrome bit generation logic.

FIG. 7 is a block diagram of an embodiment of check bit generation logic and syndrome bit generation logic. The check bit and syndrome bit generation logics can be used in an embodiment of an ECC engine that uses a code matrix that maps potential third bit errors resulting from miscorrection of two bits errors to an opposite code word half from where the two bit error was detected. Check bit generation logic 702 represents logic to perform ECC operations to generate a check bit. Syndrome bit generation logic 704 represents logic to perform ECC operations to generate a syndrome bit to compare against the check bit. For purposes of illustration in the drawing, only logic related to check bit CB[0] is illustrated. In one embodiment, various data bits, but not necessarily all data bits, are selectively XORed together to generate the check bit, and on the reverse side to generate the syndrome bit. It will be understood that other data bit mappings can be used.

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 720 and XOR 750. The XOR operation has a commutative property, and the XORing of multiple pairs of inputs, and then the series XORing of the outputs of those operations can be interchanged in any order with the same result. Thus, XOR 720 and XOR 750 have the practical effect of modulo 2 addition, which is also equivalent to odd parity detection. Odd parity detection provides a '1' as the output when there is an odd number of ones among the inputs, and an output zero when there is an even number of ones among the inputs.

For check bit generation 702, the ECC engine receives write data word 710 (D[127:0]) from the host. In one embodiment, XOR 720 receives as inputs D[127:66] and D[10:0]. Again, it will be understood that different data bit combinations can be used. Different bit combinations can be used for different check bits (e.g., CB[1], CB[2], . . . ). The combination is preconfigured to ensure that the same operations are performed each time to obtain consistent results. One example for check bit[0] can thus be represented as follows: CB[0]=D[127]^D[126]^ . . . ^D[67]^D[66]^D[10]^D[9]^ . . . ^D[1]^D[0], where the operator '^' represents an XOR operation.

For syndrome bit generation 704, the ECC engine receives write data word 730 (D[127:0]) from the memory array. The ECC engine also receives check bit word 740 (CB[7:0]). In one embodiment, XOR 750 receives as inputs D[127:66] and D[10:0] and CB[0]. Again, it will be understood that different data bit combinations can be used, but that syndrome generation will perform the same operation as check bit generation for a corresponding check bit. Thus, as illustrated, syndrome bit generation 704 performs the same operations to generate SB[0] as check bit generation 702 performs to generate CB[0]. The difference with syndrome bit generation 704 is that the ECC engine also XORs the corresponding check bit (in this example, CB[0]) to determine if there is a difference. One example for syndrome bit[0] can thus be represented as follows: SB[0]=D[127]^D[126]^ . . . ^D[67]^D[66]^D[10]^D[9]^ . . . ^D[1]^ D[0]^CB[0], where the operator '^' represents an XOR operation.

While CB[0] can be represented as another input of XOR 750, for purposes of illustrating that the basic XOR operations are the same between check bit generation 702 and syndrome bit generation 704, and that the syndrome generation further includes the check bit operand, syndrome bit generation also includes XOR 752 cascaded with XOR 750.

It will be understood that the end result of syndrome bit generation 704 will be a zero output (or zero syndrome) if the stored data bits are unchanged or uncorrupted from the received data bits (or read data word 730 matches write data word 710). It will be understood that some combination of check bits and syndrome bits should test all data word bits to ensure that no bits are corrupted. If read data word 730 is identical to write data word 710, XOR 750 will produce the same output as XOR 720, which will match the value of CB[0]. Thus, the output of XOR 752 will be zero if the data is not corrupted, and will be one only if there is an error.

Figure 8:
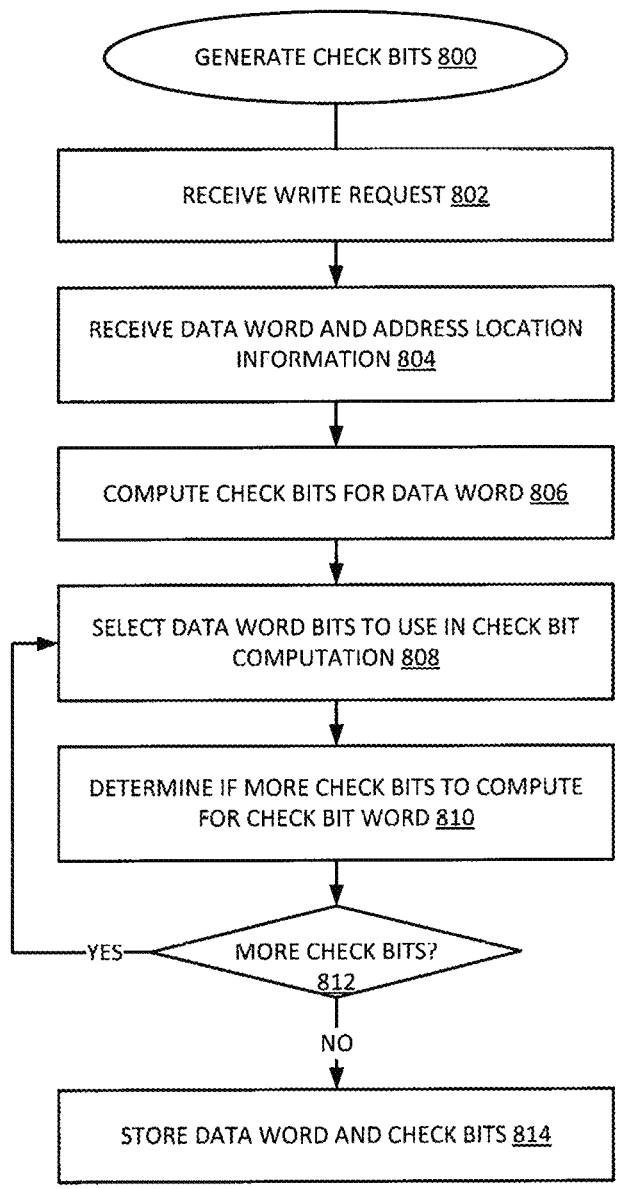
FIG. 8 is a flow diagram of an embodiment of a process for generating check bits.

FIG. 8 is a flow diagram of an embodiment of a process for generating check bits. Process 800 for generating check bits is to be performed by an ECC engine in accordance with an embodiment described herein. A memory device receives a write request, 802, and receives data word and address location information for the write request, 804. In one embodiment, the memory device includes an internal ECC engine to compute check bits for the data word, 806. The memory device can store the check bits for later use in performing ECC on reads to reduce the number of erroneous data bits returned to the memory controller.

In one embodiment, the ECC engine selects data word bits and routes them to logic to compute a check bit, 808. The ECC engine can repeat the check bit calculation for all check bits in a check bit word (e.g., 8 bits for a 128 bit data word). In one embodiment, the calculation includes XOR logic as described above in FIG. 7. In one embodiment, the ECC engine includes parallel logic for all check bits to be calculated in parallel (e.g., different paths with separate logic). Conceptually, process 800 represents the ECC engine determining if more check bits are to be computed to illustrate that separate computations can be performed for each of the separate check bits, 810. If there are more check bits to calculate, 812 YES branch, the ECC engine selects the data word bits for the following check bit, which will be a different pattern of bits from the previous check bit, 808, and will repeat for all check bits. When there are no more check bits to calculate, 812 NO branch, the memory device stores the data word and its associated check bits in the memory array, 814.

Figure 9:
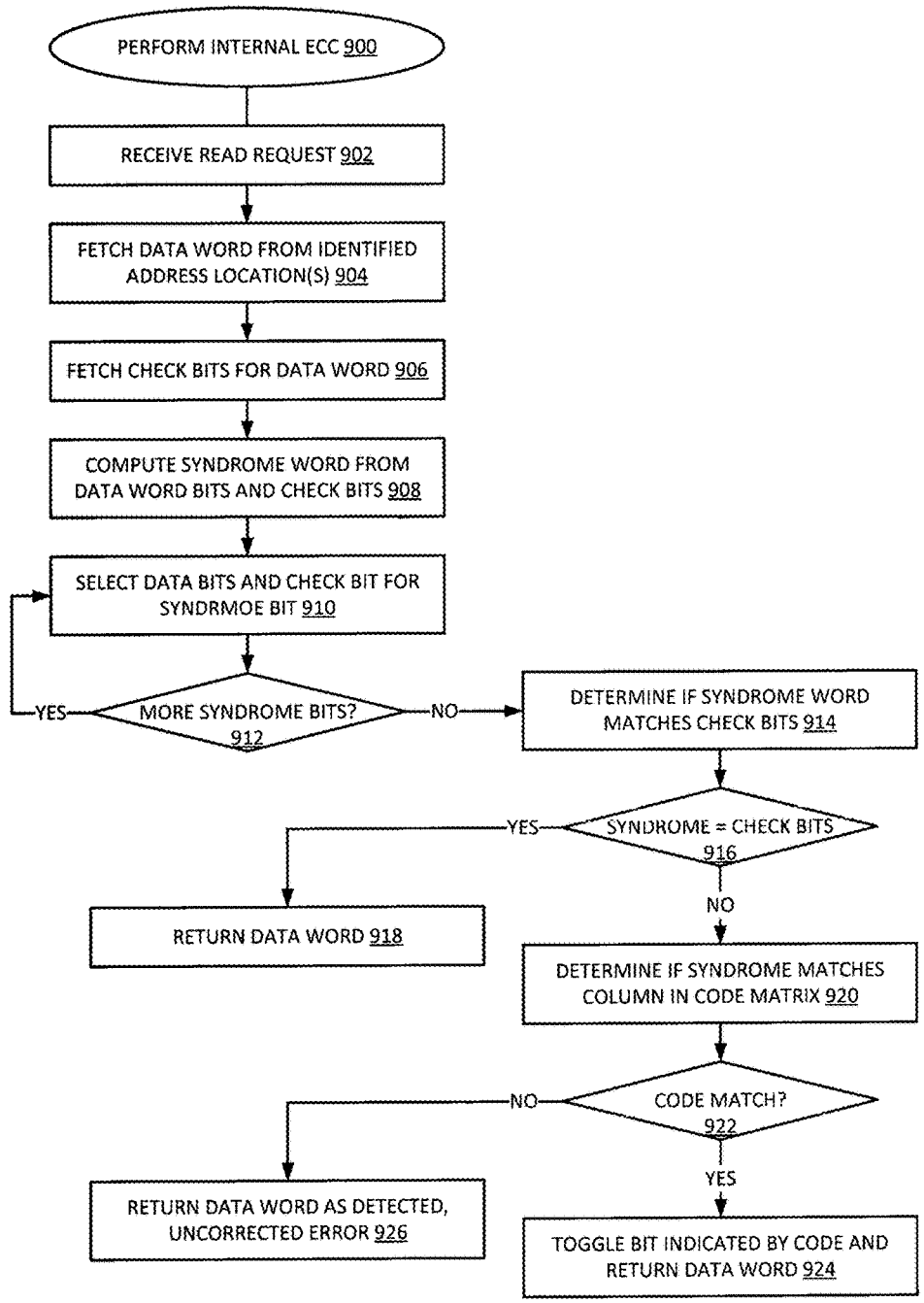
FIG. 9 is a flow diagram of an embodiment of a process for performing ECC with a code matrix that prevents two bit errors for being miscorrected into three bit errors in a code word half.

FIG. 9 is a flow diagram of an embodiment of a process for performing ECC with a code matrix that prevents two bit errors for being miscorrected into three bit errors in a code word half. Process 900 for performing internal ECC is to be performed by an ECC engine in accordance with an embodiment described herein. In one embodiment, process 900 includes a common path with process 800 in computing the syndrome. A memory device receives a read request, 902, and fetches a data word from the address location identified in the read request, 904. The memory device fetches check bits associated with the data word, 906.

In one embodiment, the memory device includes an internal ECC engine to compute syndrome bits for the data word, 908. The memory device can use the stored check bits to correct single bit errors to reduce the number of erroneous data bits returned to the memory controller. In one embodiment, the ECC engine selects data word bits and an associated check bit and routes them to logic to compute a syndrome bit, 910. The ECC engine can repeat the check bit calculation for all syndrome bits to be computed (e.g., 8 bits for a 128 bit data word). In one embodiment, the calculation includes XOR logic as described above in FIG. 7. In one embodiment, the ECC engine includes parallel logic for all check bits to be calculated in parallel (e.g., different paths with separate logic). Conceptually, process 900 represents the ECC engine determining if more syndrome bits are to be computed to illustrate that separate computations can be performed for each of the separate syndrome bits, 912.

If there are more syndrome bits to calculate, 912 YES branch, the ECC engine selects the data word bits and check bit for the following syndrome bit, which will be a different pattern of bits from the previous syndrome bit and a matching pattern of bits to the selected check bit, 910, and will repeat for all check bits. When there are no more syndrome bits to calculate, 912 NO branch, in one embodiment, the ECC engine determines if the syndrome word matches the corresponding check bit word, 914. As mentioned above, such a determination can be accomplished by XORing each syndrome bit with the corresponding check bit to determine if there is a zero syndrome or non-zero syndrome. A non-zero syndrome indicates an error in the data word.

Thus, if the syndrome bits match the check bits, 916 YES branch, the ECC engine can identify the data as no errors, and the memory device can return the data word to the memory controller, 918. If the syndrome bits do not match the check bits, 916 NO branch, the ECC engine can determine if the syndrome matches a column in the code matrix, 920. The code matrix is a code matrix in accordance with what is described herein, wherein the check operations occur on halves of the data word and the code matrix is operated on with corresponding halves. The error correction occurs over the whole word, which is over the two halves. A non-zero syndrome for a single bit error can occur anywhere in the code matrix, and identify which data word bit to flip to correct the error. If a data word half includes two bit errors, the ECC operations will effect an XOR of the error codes of the two incorrect bits. The XOR of the two codes in one half will generate a code that appears in the other half of the code matrix, and will cause the ECC engine to flip a bit in the opposite half of the data word. Traditionally, such a code could occur in the same half, resulting in a three bit error in a single half. As described, such a three bit error in a single half is avoided in one half by toggling a bit in the other half.

With such a mapping, the ECC logic can provide greater confidence to the host that the internal ECC of the memory device will be complementary to the system-level ECC, instead of creating more complex errors that the host cannot correct. The ECC engine can determine when there is a code match between the syndrome and a code of the matrix, 922 YES branch, and toggle the data bit indicated by the code, and return the corrected data word, 924. The ECC engine can determine when there is not a code match, 922 NO branch, and return the data word uncorrected to the memory controller as having a detected, uncorrected error, 926.

Figure 10:
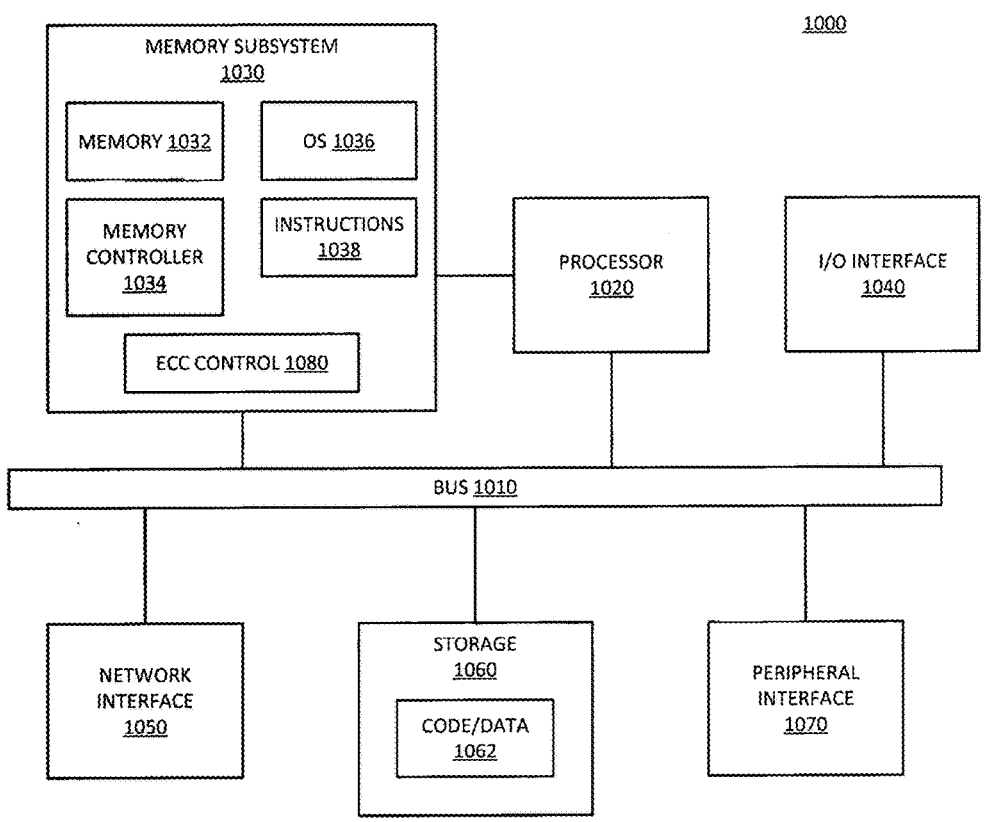
FIG. 10 is a block diagram of an embodiment of a computing system in which a memory device performs internal ECC with a code matrix that prevents two bit errors for being miscorrected into three bit errors in a code word half can be implemented.

FIG. 10 is a block diagram of an embodiment of a computing system in which a memory device performs internal ECC with a code matrix that prevents two bit errors for being miscorrected into three bit errors in a code word half can be implemented. System 1000 represents a computing device in accordance with any embodiment described herein, and can be a laptop computer, a desktop computer, a server, a gaming or entertainment control system, a scanner, copier, printer, routing or switching device, or other electronic device. System 1000 includes processor 1020, which provides processing, operation management, and execution of instructions for system 1000. Processor 1020 can include any type of microprocessor, central processing unit (CPU), processing core, or other processing hardware to provide processing for system 1000. Processor 1020 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 1030 represents the main memory of system 1000, and provides temporary storage for code to be executed by processor 1020, or data values to be used in executing a routine. Memory subsystem 1030 can include one or more memory devices such as read-only memory (ROM), flash memory, one or more varieties of random access memory (RAM), or other memory devices, or a combination of such devices. Memory subsystem 1030 stores and hosts, among other things, operating system (OS) 1036 to provide a software platform for execution of instructions in system 1000. Additionally, other instructions 1038 are stored and executed from memory subsystem 1030 to provide the logic and the processing of system 1000. OS 1036 and instructions 1038 are executed by processor 1020. Memory subsystem 1030 includes memory device 1032 where it stores data, instructions, programs, or other items. In one embodiment, memory subsystem includes memory controller 1034, which is a memory controller to generate and issue commands to memory device 1032. It will be understood that memory controller 1034 could be a physical part of processor 1020.

Processor 1020 and memory subsystem 1030 are coupled to bus/bus system 1010. Bus 1010 is an abstraction that represents any one or more separate physical buses, communication lines/interfaces, and/or point-to-point connections, connected by appropriate bridges, adapters, and/or controllers. Therefore, bus 1010 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1010 can also correspond to interfaces in network interface 1050.

System 1000 also includes one or more input/output (I/O) interface(s) 1040, network interface 1050, one or more internal mass storage device(s) 1060, and peripheral interface 1070 coupled to bus 1010. I/O interface 1040 can include one or more interface components through which a user interacts with system 1000 (e.g., video, audio, and/or alphanumeric interfacing). Network interface 1050 provides system 1000 the ability to communicate with remote devices (e.g., servers, other computing devices) over one or more networks. Network interface 1050 can include an Ethernet adapter, wireless interconnection components, USB (universal serial bus), or other wired or wireless standards-based or proprietary interfaces.

Storage 1060 can be or include any conventional medium for storing large amounts of data in a nonvolatile manner, such as one or more magnetic, solid state, or optical based disks, or a combination. Storage 1060 holds code or instructions and data 1062 in a persistent state (i.e., the value is retained despite interruption of power to system 1000). Storage 1060 can be generically considered to be a "memory," although memory 1030 is the executing or operating memory to provide instructions to processor 1020. Whereas storage 1060 is nonvolatile, memory 1030 can include volatile memory (i.e., the value or state of the data is indeterminate if power is interrupted to system 1000).

Peripheral interface 1070 can include any hardware interface not specifically mentioned above. Peripherals refer generally to devices that connect dependently to system 1000. A dependent connection is one where system 1000 provides the software and/or hardware platform on which operation executes, and with which a user interacts.

In one embodiment, memory 1032 is a DRAM. In one embodiment, processor 1020 represents one or more processors that execute data stored in one or more DRAM memories 1032. In one embodiment, network interface 1050 exchanges data with another device in another network location, and the data is data stored in memory 1032. In one embodiment, system 1000 includes ECC control 1080 to perform internal ECC within a memory, and thus ECC control 1080 could be at least partially represented within memory 1032. ECC control 1080 can also represent system-wide ECC at memory controller 1034, which uses the fact that memory 1032 performs internal ECC to provide more robust ECC for system 1000. ECC control 1080 with respect to internal ECC in memory 1032 includes a code matrix in accordance with any embodiment described herein. Thus, ECC control 1080 includes a code matrix that can be operated in two portions corresponding to two segments of the data words for read and write operations. A bitwise XOR of two codes in different portions results in a code that appears either in the other portion or does not appear in the code matrix.

Figure 11:
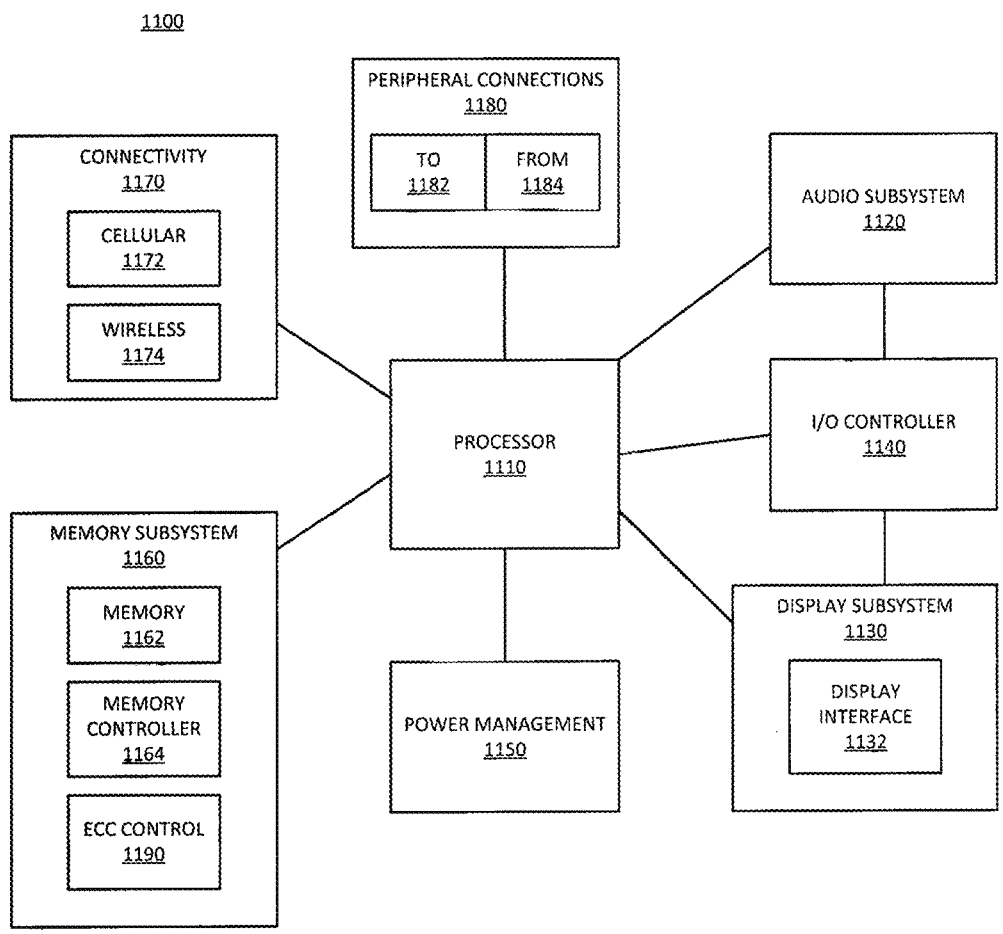
FIG. 11 is a block diagram of an embodiment of a mobile device in which a memory device performs internal ECC with a code matrix that prevents two bit errors for being miscorrected into three bit errors in a code word half can be implemented.

FIG. 11 is a block diagram of an embodiment of a mobile device in which a memory device performs internal ECC with a code matrix that prevents two bit errors for being miscorrected into three bit errors in a code word half can be implemented. Device 1100 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting device 1100 to another device. The processing operations can also include operations related to audio I/O and/or display I/O.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software (e.g., drivers) components that provide a visual and/or tactile display for a user to interact with the computing device. Display subsystem 1130 includes display interface 1132, which includes the particular screen or hardware device used to provide a display to a user. In one embodiment, display interface 1132 includes logic separate from processor 1110 to perform at least some processing related to the display. In one embodiment, display subsystem 1130 includes a touchscreen device that provides both output and input to a user. In one embodiment, display subsystem 1130 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 1140 represents hardware devices and software components related to interaction with a user. I/O controller 1140 can operate to manage hardware that is part of audio subsystem 1120 and/or display subsystem 1130. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100. The input can be part of direct user interaction, as well as providing environmental input to the system to influence its operations (such as filtering for noise, adjusting displays for brightness detection, applying a flash for a camera, or other features). In one embodiment, device 1100 includes power management 1150 that manages battery power usage, charging of the battery, and features related to power saving operation.

Memory subsystem 1160 includes memory device(s) 1162 for storing information in device 1100. Memory subsystem 1160 can include nonvolatile (state does not change if power to the memory device is interrupted) and/or volatile (state is indeterminate if power to the memory device is interrupted) memory devices. Memory 1160 can store application data, user data, music, photos, documents, or other data, as well as system data (whether long-term or temporary) related to the execution of the applications and functions of system 1100. In one embodiment, memory subsystem 1160 includes memory controller 1164 (which could also be considered part of the control of system 1100, and could potentially be considered part of processor 1110). Memory controller 1164 includes a scheduler to generate and issue commands to memory device 1162.

Connectivity 1170 includes hardware devices (e.g., wireless and/or wired connectors and communication hardware) and software components (e.g., drivers, protocol stacks) to enable device 1100 to communicate with external devices. The external device could be separate devices, such as other computing devices, wireless access points or base stations, as well as peripherals such as headsets, printers, or other devices.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading and/or uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory 1162 is a DRAM. In one embodiment, processor 1110 represents one or more processors that execute data stored in one or more DRAM memories 1162. In one embodiment, connectivity 1170 includes a network interface to exchange data with another device in another network location, and the data is data stored in memory 1162. In one embodiment, system 1100 includes ECC control 1190 to perform internal ECC within a memory, and thus ECC control 1190 could be at least partially represented within memory 1162. ECC control 1190 can also represent system-wide ECC at memory controller 1164, which uses the fact that memory 1162 performs internal ECC to provide more robust ECC for system 1100. ECC control 1190 with respect to internal ECC in memory 1162 includes a code matrix in accordance with any embodiment described herein. Thus, ECC control 1190 includes a code matrix that can be operated in two portions corresponding to two segments of the data words for read and write operations. A bitwise XOR of two codes in different portions results in a code that appears either in the other portion or does not appear in the code matrix.

In one aspect, a dynamic random access memory device (DRAM) includes: a storage array to store an N-bit data word, and error checking and correction (ECC) bits associated with the data word; an ECC code store to store a code matrix, the code matrix to include N codes with a first portion of (N/2) codes and a second portion of (N/2) codes, the N codes corresponding to the N bits of the data word, respectively; and ECC circuitry to perform internal ECC in the DRAM with the ECC bits and code matrix in response to a request to access the data word, including circuitry to compute first and second error checks for first and second (N/2)-bit segments of the data word, respectively, based on the first and second portions of the code matrix, respectively; wherein a bitwise XOR (exclusive OR) of any two codes in the first portion of the code matrix or a bitwise XOR of any two codes in the second portion of the code matrix is to generate a code that is either not in the code matrix or is in the other portion of the code matrix.

In one embodiment, N equals 128. In one embodiment, the DRAM includes a double data rate version 4 extended (DDR4E) compliant synchronous dynamic random access memory device (SDRAM). In one embodiment, the ECC circuitry to perform internal ECC is to perform single bit error correction (SEC) to correct a single bit error (SBE) in the first segment, or the second segment, or SBEs in both the first and second segments. In one embodiment, the ECC circuitry is to perform internal ECC without receipt of a request from an associated memory controller to perform ECC. In one embodiment, the DRAM includes a 4-bit data I/O (input/output) interface (a x4 data interface), and wherein each of the N codes provides ECC information for accesses of four separate (N/4)-bit columns. In one embodiment, the DRAM includes an 8-bit data I/O (input/output) interface (a x8 data interface), and wherein each of the N codes provides ECC information for accesses of two separate (N/2)-bit columns. In one embodiment, the DRAM includes a 16-bit data I/O (input/output) interface (a x16 data interface), and wherein each of the N codes provides ECC information for accesses of two separate (N/2)-bit columns, the two separate columns from two separate bank groups. In one embodiment, the ECC circuitry is to prefetch data from the separate bank groups to perform ECC on two segments from separate data words as a single N-bit data word, and to transmit only a selected segment.

In one aspect, a method for error correction management in a memory subsystem includes: receiving a read request for an N-bit data word at a DRAM; accessing the data word and error checking and correction (ECC) bits associated with the data word; computing an ECC syndrome based on the data word and the ECC bits, including computing first and second error checks for first and second (N/2)-bit segments of the data word, respectively; comparing the ECC syndrome with a code matrix, wherein the code matrix includes N codes with a first portion of (N/2) codes and a second portion of (N/2) codes, the N codes corresponding respectively to the N bits of the data word, the comparing including comparing the first error check with the first portion, and comparing the second error check with the second portion; and for a detected error in the first segment and for a detected error in the second segment, toggling a bit of the data word corresponding to a code that matches the ECC syndrome, wherein a bitwise XOR (exclusive OR) of any two adjacent codes in the first portion of the code matrix or a bitwise XOR of any two adjacent codes in the second portion of the code matrix is to generate a code that is either not in the code matrix or is in the other portion of the code matrix.

In one embodiment, N equals 128. In one embodiment, N equals 128, and wherein the DRAM includes a double data rate version 4 extended (DDR4E) compliant synchronous dynamic random access memory device (SDRAM). In one embodiment, further comprising performing single bit error correction (SEC) to correct a single bit error (SBE) in the first segment, or the second segment. In one embodiment, further comprising performing internal ECC without receipt of a request from an associated memory controller to perform ECC. In one embodiment, the DRAM includes a 4-bit data I/O (input/output) interface (a x4 data interface), and wherein each of the N codes provides ECC information for accesses of four separate (N/4)-bit columns. In one embodiment, the DRAM includes an 8-bit data I/O (input/output) interface (a x8 data interface), and wherein each of the N codes provides ECC information for accesses of two separate (N/2)-bit columns. In one embodiment, the DRAM includes a 16-bit data I/O (input/output) interface (a x16 data interface), and wherein each of the N codes provides ECC information for accesses of two separate (N/2)-bit columns, the two separate columns from two separate bank groups. In one embodiment, the ECC circuitry is to prefetch data from the separate bank groups to perform ECC on two segments from separate data words as a single N-bit data word, and to transmit only a selected segment.

In one aspect, a system with a memory subsystem includes: a memory controller; and multiple synchronous dynamic random access memory devices (SDRAMs) including a storage array to store an N-bit data word, and error checking and correction (ECC) bits associated with the data word; an ECC code store to store a code matrix, the code matrix to include N codes with a first portion of (N/2) codes and a second portion of (N/2) codes, the N codes corresponding to the N bits of the data word, respectively; and ECC circuitry to perform internal ECC in the SDRAM with the ECC bits and code matrix in response to a request to access the data word, including circuitry to compute first and second error checks for first and second (N/2)-bit segments of the data word, respectively, based on the first and second portions of the code matrix, respectively; wherein a bitwise XOR (exclusive OR) of any two codes in the first portion of the code matrix or any two codes in the second portion of the code matrix is to generate a code that is either not in the code matrix or is in the other portion of the code matrix.

In one embodiment, N equals 128. In one embodiment, the DRAM includes a double data rate version 4 extended (DDR4E) compliant synchronous dynamic random access memory device (SDRAM). In one embodiment, the ECC circuitry to perform internal ECC is to perform single bit error correction (SEC) to correct a single bit error (SBE) in the first segment, or the second segment, or SBEs in both the first and second segments. In one embodiment, the ECC circuitry is to perform internal ECC without receipt of a request from an associated memory controller to perform ECC. In one embodiment, the DRAM includes a 4-bit data I/O (input/output) interface (a x4 data interface), and wherein each of the N codes provides ECC information for accesses of four separate (N/4)-bit columns. In one embodiment, the DRAM includes an 8-bit data I/O (input/output) interface (a x8 data interface), and wherein each of the N codes provides ECC information for accesses of two separate (N/2)-bit columns. In one embodiment, the DRAM includes a 16-bit data I/O (input/output) interface (a x16 data interface), and wherein each of the N codes provides ECC information for accesses of two separate (N/2)-bit columns, the two separate columns from two separate bank groups. In one embodiment, the ECC circuitry is to prefetch data from the separate bank groups to perform ECC on two segments from separate data words as a single N-bit data word, and to transmit only a selected segment. In one embodiment, further comprising a multicore processor coupled to the memory controller, at least one core of the processor to execute data stored in the SDRAMs. In one embodiment, further comprising a network adapter coupled to exchange data between the SDRAMs and a remote network location. In one embodiment, further comprising a display communicatively coupled to the multicore processor.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A dynamic random access memory device (DRAM), comprising:

a storage array to store an N-bit data word, and error checking and correction (ECC) bits associated with the data word;

an ECC code store to store a code matrix, the code matrix to include N codes with a first portion of (N/2) codes and a second portion of (N/2) codes, the N codes corresponding to the N bits of the data word, respectively; and ECC circuitry to perform internal ECC in the DRAM with the ECC bits and code matrix in response to a request to access the data word, including circuitry to compute first and second error checks for first and second (N/2)-bit segments of the data word, respectively, based on the first and second portions of the code matrix, respectively;

wherein a bitwise XOR (exclusive OR) of any two codes in the first portion of the code matrix or a bitwise XOR of any two codes in the second portion of the code matrix is to generate a code that is either not in the code matrix or is in the other portion of the code matrix.

2. The DRAM of claim 1, wherein N equals 128.

3. The DRAM of claim 2, wherein the DRAM includes a double data rate version 4 extended (DDR4E) compliant synchronous dynamic random access memory device (SDRAM).

4. The DRAM of claim 1, wherein the ECC circuitry to perform internal ECC is to perform single bit error correction (SEC) to correct a single bit error (SBE) in the first segment, or the second segment.

5. The DRAM of claim 1, wherein the ECC circuitry is to perform internal ECC without receipt of a request from an associated memory controller to perform ECC.

6. The DRAM of claim 1, wherein the DRAM includes a 4-bit data I/O (input/output) interface (a x4 data interface), and wherein each of the N codes provides ECC information for accesses of four separate (N/4)-bit columns.

7. The DRAM of claim 1, wherein the DRAM includes an 8-bit data I/O (input/output) interface (a x8 data interface), and wherein each of the N codes provides ECC information for accesses of two separate (N/2)-bit columns.

8. The DRAM of claim 1, wherein the DRAM includes a 16-bit data I/O (input/output) interface (a x16 data interface), and wherein each of the N codes provides ECC information for accesses of two separate (N/2)-bit columns, the two separate columns from two separate bank groups.

9. The DRAM of claim 8, wherein the ECC circuitry is to prefetch data from the separate bank groups to perform ECC on two segments from separate data words as a single N-bit data word, and to transmit only a selected segment.

10. A method for error correction management in a memory subsystem, comprising:

receiving a read request for an N-bit data word at a DRAM;

accessing the data word and error checking and correction (ECC) bits associated with the data word;

computing an ECC syndrome based on the data word and the ECC bits, including computing first and second error checks for first and second (N/2)-bit segments of the data word, respectively;

comparing the ECC syndrome with a code matrix, wherein the code matrix includes N codes with a first portion of (N/2) codes and a second portion of (N/2) codes, the N codes corresponding respectively to the N bits of the data word, the comparing including comparing the first error check with the first portion, and comparing the second error check with the second portion; and for a detected error in the first segment and for a detected error in the second segment, toggling a bit of the data word corresponding to a code that matches the ECC syndrome, wherein a bitwise XOR (exclusive OR) of any two adjacent codes in the first portion of the code matrix or a bitwise XOR of any two adjacent codes in the second portion of the code matrix is to generate a code that is either not in the code matrix or is in the other portion of the code matrix.

11. The method of claim 10, wherein N equals 128, and wherein the DRAM includes a double data rate version 4 extended (DDR4E) compliant synchronous dynamic random access memory device (SDRAM).

12. The method of claim 10, wherein the DRAM includes a 4-bit data I/O (input/output) interface (a x4 data interface), and wherein each of the N codes provides ECC information for accesses of four separate (N/4)-bit columns.

13. The method of claim 10, wherein the DRAM includes an 8-bit data I/O (input/output) interface (a x8 data interface), and wherein each of the N codes provides ECC information for accesses of two separate (N/2)-bit columns.

14. The method of claim 10, wherein the DRAM includes a 16-bit data I/O (input/output) interface (a x16 data interface), and wherein each of the N codes provides ECC information for accesses of two separate (N/2)-bit columns, the two separate columns from two separate bank groups.

15. A system with a memory subsystem, comprising:

a memory controller; and multiple synchronous dynamic random access memory devices (SDRAMs) including a storage array to store an N-bit data word, and error checking and correction (ECC) bits associated with the data word;

an ECC code store to store a code matrix, the code matrix to include N codes with a first portion of (N/2) codes and a second portion of (N/2) codes, the N codes corresponding to the N bits of the data word, respectively; and ECC circuitry to perform internal ECC in the SDRAM with the ECC bits and code matrix in response to a request to access the data word, including circuitry to compute first and second error checks for first and second (N/2)-bit segments of the data word, respectively, based on the first and second portions of the code matrix, respectively;

wherein a bitwise XOR (exclusive OR) of any two codes in the first portion of the code matrix or any two codes in the second portion of the code matrix is to generate a code that is either not in the code matrix or is in the other portion of the code matrix.

16. The system of claim 15, wherein N equals 128, and wherein the SDRAM includes a double data rate version 4 extended (DDR4E) compliant SDRAM.

17. The system of claim 15, wherein the SDRAM includes a 4-bit data I/O (input/output) interface (a x4 data interface), and wherein each of the N codes to provide ECC information for accesses of four separate (N/4)-bit columns.

18. The system of claim 15, wherein the SDRAM includes an 8-bit data I/O (input/output) interface (a x8 data interface), and wherein each of the N codes to provide ECC information for accesses of two separate (N/2)-bit columns.

19. The system of claim 15, wherein the SDRAM includes a 16-bit data I/O (input/output) interface (a x16 data interface), and wherein each of the N codes to provide ECC information for accesses of two separate (N/2)-bit columns, the two separate columns from two separate bank groups.

20. The system of claim 15, further comprising a multi-core processor coupled to the memory controller, at least one core of the processor to execute data stored in the SDRAMs.

21. The system of claim 20, further comprising a network adapter coupled to exchange data between the SDRAMs and a remote network location.

22. The system of claim 20, further comprising a display communicatively coupled to the multicore processor.

* * * * *